US007986220B2

(12) United States Patent
Kiyomasa et al.

(10) Patent No.: US 7,986,220 B2
(45) Date of Patent: Jul. 26, 2011

(54) AUTOMATIC DOOR SYSTEM

(75) Inventors: Yoshinari Kiyomasa, Kobe (JP); Koji Kakuyama, Kobe (JP); Shigeaki Sasaki, Kobe (JP)

(73) Assignee: Nabtesco Corporation, Tokyo (JP)

( * ) Notice: Subject to any disclaimer, the term of this patent is extended or adjusted under 35 U.S.C. 154(b) by 471 days.

(21) Appl. No.: 12/278,450

(22) PCT Filed: Feb. 2, 2007

(86) PCT No.: PCT/JP2007/051792
§ 371 (c)(1), (2), (4) Date: Aug. 6, 2008

(87) PCT Pub. No.: WO2007/091491
PCT Pub. Date: Aug. 16, 2007

(65) Prior Publication Data

US 2009/0031633 A1 Feb. 5, 2009

(30) Foreign Application Priority Data

Feb. 8, 2006 (JP) ................................ 2006-031058

(51) Int. Cl.

| | |
|---|---|
| ***G08B 9/00*** | (2006.01) |
| ***G05B 5/00*** | (2006.01) |
| ***G05D 3/00*** | (2006.01) |
| ***H02H 7/08*** | (2006.01) |
| ***H02P 1/04*** | (2006.01) |
| ***H02P 3/00*** | (2006.01) |
| ***H02P 7/00*** | (2006.01) |
| ***G01R 27/28*** | (2006.01) |
| ***G01R 31/00*** | (2006.01) |
| ***G01R 31/14*** | (2006.01) |

(52) U.S. Cl. .................... 340/286.02; 318/467; 702/120

(58) Field of Classification Search ............... 340/545.1, 340/545.3, 545.9, 572.1–572.9, 286.02, 691.6; 318/466, 467; 702/113–116, 119, 120, 122, 702/123
See application file for complete search history.

(56) References Cited

U.S. PATENT DOCUMENTS 4,529,920 A * 7/1985 Yoshida et al. ............... 318/466
(Continued)

FOREIGN PATENT DOCUMENTS

JP 62-161038 7/1987
(Continued)

OTHER PUBLICATIONS

International Search Report for PCT/JP2007/051792 dated Apr. 24, 2007.

*Primary Examiner* — Jennifer Mehmood
(74) *Attorney, Agent, or Firm* — Duane Morris LLP

(57) ABSTRACT

Whether interruption is present in the connections of automatic door constituting units is detected.
A plurality of automatic door constituting units (4, 8, 10, 12, 20, 24 and 26) are interconnected in such a manner that they can communicate with each other via a bus (2). The automatic door constituting units include a door controller (4) for controlling opening and closing of a door. The door controller (4) successively calls the other automatic door constituting units one by one via the bus (2), and the other automatic door constituting units send a response to the calling via the bus (2). The door controller (4) judges that the automatic door constituting unit the door controller (4) called is disconnected from the bus (2), when said called automatic door constituting unit does not send a response within a predetermined time after the calling.

11 Claims, 15 Drawing Sheets

U.S. PATENT DOCUMENTS

| | | | | |
|---|---|---|---|---|
| 5,003,290 | A * | 3/1991 | Lindquist et al. | 340/545.1 |
| 5,400,246 | A * | 3/1995 | Wilson et al. | 700/17 |
| 5,884,237 | A | 3/1999 | Kanki et al. | |
| 6,310,548 | B1 * | 10/2001 | Stephens et al. | 340/540 |
| 7,737,860 | B2 * | 6/2010 | Banta et al. | 340/691.6 |
| 2004/0081234 | A1 | 4/2004 | Kajita | |

FOREIGN PATENT DOCUMENTS

| | | | |
|---|---|---|---|
| JP | 08-235016 | | 9/1996 |
| JP | 10-046918 | | 2/1998 |
| JP | 2004-158000 | | 6/2004 |
| JP | 2004316283 | A * | 11/2004 |

* cited by examiner

AUTOMATIC DOOR SYSTEM

TECHNICAL FIELD

The present invention relates to an automatic door system and, more particularly, to interconnection of units constituting an automatic door system.

BACKGROUND OF THE INVENTION

An automatic door system is composed of plural automatic door constituting units. Such automatic door constituting units include, for example, a door control unit, sensors, and an electric lock. The door control unit controls the opening and closing of a door. The sensors include one for sensing a person approaching the door in order to open the door. The sensors include also one for sensing a person near the door in order to prevent the door from colliding with the person when it is opened. The electric lock is for locking the automatic door system when a store with the system installed therein is to be closed. The sensors and the electric lock of the automatic door system are frequently connected to such door control unit. An example of such automatic door system is disclosed in Patent Literature 1.

In the automatic door system of Patent Literature 1, a plurality of sensors and other units are connected to a door control unit composed of a CPU, a RAM, a ROM and an EEPROM via input/output circuits. Many of the sensors are arranged to actuate a switch connected to the door control unit through an input/output circuit when detecting a person.

[Patent Literature 1] JP 10-46918 A

DISCLOSURE OF THE INVENTION

Problems to be Solved by the Invention

Automatic door systems are manufactured in accordance with various specifications, and the models and numbers of sensors to be connected are different for different specifications. Furthermore, some automatic door systems have an electric lock like the one mentioned above, and some others, like the one shown in Patent Literature 1, do not. It is desirable that a common door control unit be useable for various specifications. For that purpose, an a-contact is frequently use as the above-stated switch, which is open when no person is detected or sensed, and is closed when a person is detected. Also, an a-contact is used as the electric lock, which is open when the door is not locked, and is closed when the door is locked. Where the a-contacts are used, when communication failure occurs by, for example, disconnection in the path between the sensor and the input/output circuit in the door control unit, the door control unit may erroneously judge as if the door system was in the state in which no person is detected even though the sensor is detecting a person. Similarly, even when communication failure occurs by, for example, interruption in the path between the electric lock and the input/output circuit in the door control unit, the door control unit cannot know such communication failure due to the line interruption.

An object of the present invention is to provide an automatic door system, which can detect whether or not communication failure, such as interruption in the lines interconnecting the automatic door constituting units.

Means to Solve the Problem

An automatic door system according to an aspect of the invention includes a bus, to which a plurality of automatic door constituting units are connected. The automatic door constituting units can communicate with each other through the bus. At least one of the plural automatic door constituting units is a door control unit for controlling the opening and closing of the door, and the other automatic door constituting units are those which are selected from a plurality of units provided beforehand. The automatic door constituting units are, for example, a sensor for sensing or detecting a person and/or an article, locking means for locking the door, display means for providing information to people using the door. Out of such units, ones fulfilling the items of the specifications of a desired door system are connected to the bus. The door control unit is arranged to be capable of calling the other automatic door constituting units via the bus, and these other automatic door constituting units are arranged to be capable of responding to the calling via the bus. When the other door constituting unit the door control unit called does not respond even when a first predetermined time lapses from the calling, the door control unit judges that failure in communication with the called automatic door constituting unit has occurred.

In the automatic door system with this arrangement, the door control unit is connected with the other automatic door constituting units by a bus and can communicate with the other units. Accordingly, when the door control unit calls another automatic door constituting unit and no response returns form that unit, it can be determined that failure in communications between the door control unit and the called unit, for example, interruption in the data bus lines or failure of transmitter/receiver circuits, has happened, which can be readily dealt with. For example, repair can be provided immediately. Alternatively, the automatic door system is operated in a mode in which the door can be moved without using the automatic door constituting unit with which communication failure due to, for example, disconnection, has happened.

The door control unit may request sending thereto of unit information representing each of the other automatic door constituting units via the bus, prepare, from the received unit information, a list of the other automatic door constituting units connected to the bus, and call the other units on the basis of the list.

With this arrangement, it can be known automatically what automatic door constituting units are used in this automatic door system. Accordingly, there is no need for manually setting the unit information of the respective units in the door control unit. In particular, when this arrangement is used at the end of the installation of the automatic door system in a site where automatic door systems according to plural different specifications, and, accordingly, employing different automatic door constituting units are installed, installation is easier because there is no need for manually setting the respective automatic door constituting units. Furthermore, the listing may be performed when power is supplied to the automatic door system, and, in such case, even when any one or more of the automatic door constituting units are out of order, the automatic door system can be operated by separating such malfunctioning unit from the bus.

The above-described other automatic door constituting units may have self-diagnosing means. The self-diagnosing means judges, for example, whether the other automatic door constituting units with the self-diagnosing means are in order, have a failure to make that unit inoperative, or have a failure in part thereof. In such case, when responding to the request made by the door control unit, the other automatic door constituting units make the diagnosis made by the self-diagnosing means contained in the response, and the door control unit performs the door control on the basis of the diagnosis obtained when receiving the response.

With this arrangement, since it is possible to find whether or not the respective automatic door constituting units are out of order, the door can be controlled with such failure taken into account, and, therefore safety can be improved.

Each of the other automatic door constituting units of the above-described automatic door system may be arranged to judge the automatic door control unit as being out of order if that automatic door constituting unit is not called within a second predetermined time after the previous calling by the automatic door control unit.

When a failure occurs in the automatic door control unit, the door control unit cannot call the other automatic door constituting units. Then, the other automatic door constituting units can judge that the door control unit becomes out of order when they are not called by the door control unit by the time when the second predetermined time period lapses from the last calling. Such judgment can be displayed on display means, for example, to urge the door caretaker to repair the door control unit.

An automatic door system according to another embodiment of the present invention includes, as the above-described embodiment, a bus and a plurality of automatic door constituting units, which can communicate with each other via the bus. At least one of the plural automatic door constituting units is a door control unit for controlling the opening and closing of a door, and the other automatic door constituting units are selected from a plurality of units provided beforehand. Each automatic door constituting unit is arranged to be called by and respond to the other automatic door constituting units via the bus. Each automatic door constituting unit judges that failure in communication with any other automatic door constituting unit has occurred when that other automatic door constituting unit does not respond within a third time period after that automatic door constituting unit called.

In the automatic door system, not only the door control unit but also all of the automatic door constituting units can call the other automatic door constituting units and judge the presence of the automatic door constituting units having communication failure due to, for example, disconnection, when no response to the calling occurs. Thus, whether or not the door control unit has communication failure such as interruption and disconnection can be determined quickly.

It may be so arranged that one of the automatic door constituting units sends out, onto the bus, a request for unit information from each of the other automatic door constituting units, prepares a list of the automatic door constituting units connected to the bus on the basis of the received unit information and its own unit information, and transmits the thus prepared list to the other automatic door constituting units through the bus, and each of the automatic door constituting units uses the list to identify the other automatic door constituting units.

With this arrangement, there is no need to set unit information of the automatic door constituting units in each units, which makes the installation easier. In particular, when this arrangement is used at the end of the installation of the automatic door system in a site where automatic door systems according to plural different specifications, and, accordingly, employing different automatic door constituting units are installed, installation is easier because there is no need for manually setting the respective automatic door constituting units. Furthermore, the listing may be performed when power is supplied to the automatic door system, and, in such case, even when, for example, any one or more of the automatic door constituting units are out of order, the automatic door system can be operated by separating such failing unit from the bus.

The respective automatic door constituting units may be provided with self-diagnosing means and make the diagnosis made by the self-diagnosing means contained in the response. Each automatic door constituting unit operates in accordance with the diagnoses in the responses from the other automatic door constituting units.

With this arrangement, like the embodiment described previously, it can be known whether each automatic door constituting unit is out of order or not, and, therefore, the door can be controlled with the failure taken into account. The result may be displayed on the display means to urge the repair.

BRIEF DESCRIPTION OF THE DRAWINGS

FIG. 13 is a flow chart of the processing performed by a door controller of an automatic door system according to a third embodiment of the present invention when the power supply for the automatic door system is turned on.

FIG. 14 is a flow chart of the processing performed by automatic door constituting units, other than the door controller, of the automatic door system according to the third embodiment when the power supply for the automatic door system is turned on.

FIG. 15 a flow chart of part of the processing performed by a door controller of an automatic door system according to a fourth embodiment of the invention when the power supply for the automatic door system is turned on.

FIG. 16 is a flow chart of the processing performed by automatic door constituting units, other than the door controller, of the automatic door system according to the fourth embodiment when the power supply for the automatic door system is turned on.

BEST MODE FOR CARRYING OUT THE INVENTION

Figure 1:
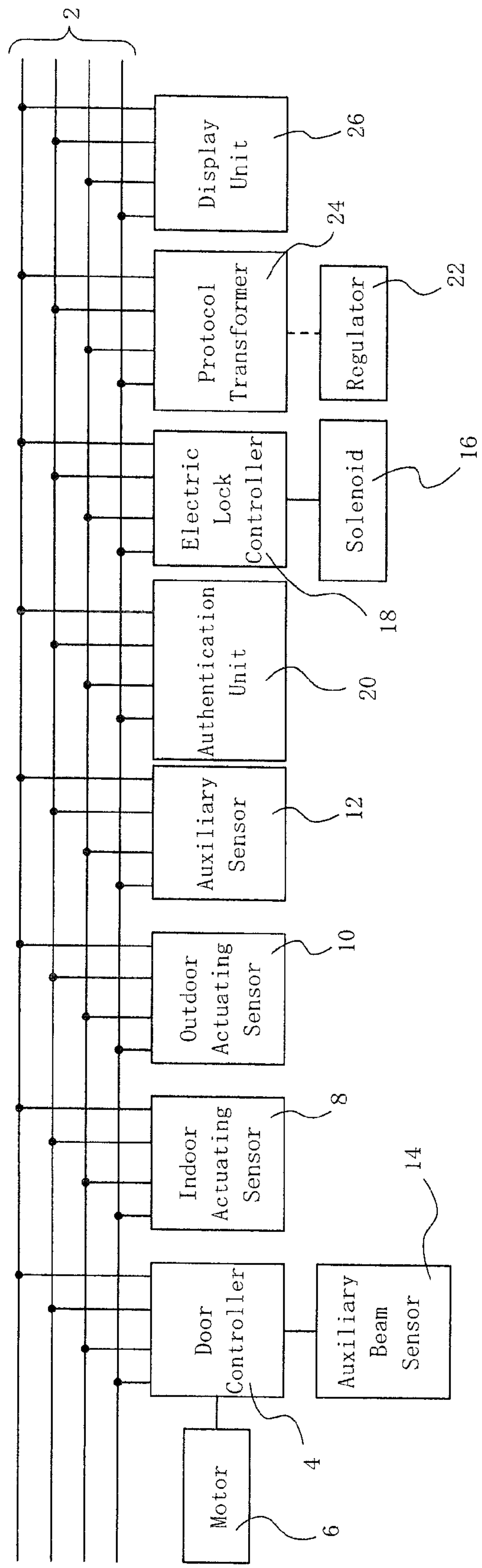
FIG. 1 is a block diagram of an automatic door system according to a first embodiment of the present invention.

As shown in FIG. 1, an automatic door system according to a first embodiment of the present invention has a bus, for example, a data bus 2. The data bus 2 is one according to the CAN (Controller Area Network) system, for example.

A plurality of automatic door constituting units 4, 8, 10, 12, 18, 20, 24 and 26 are connected to the data bus 2. Each of the automatic door constituting units 4, 8, 10, 12, 18, 20, 24 and 26 is so arranged as to be extract only necessary information out of various pieces of information sent out onto the data bus 2. The automatic door constituting units include a door controller or door control unit 4, for example. The door controller 4 extracts information required for opening and closing a door, from information pieces including detected situations transmitted by later-mentioned sensors onto the data bus 2, and principally controls a motor 6 which drives a door (not shown) of the automatic door system to open and close.

The automatic door constituting units include, in addition to the door controller or door control unit 4, sensors, such as an indoor actuating sensor 8, an outdoor actuating sensor 10, and an auxiliary sensor 12. The indoor actuating sensor 8 is disposed indoors, in a room for which the door is installed. The indoor actuating sensor 8 detects a person in the room approaching the door and transmits information containing the detected information onto the data bus 2. The outdoor actuating sensor 10 is disposed outside the room for which the door is installed. The outdoor actuating sensor 10 also detects a person outside the room approaching the door and transmits information containing the detected situation onto the data bus 2. The auxiliary sensor 12 is installed in a lower portion of a lintel. The auxiliary sensor 12 detects a person present in locations near the door, including the track of the door, and sends information containing the detected situation onto the data bus 2. Also, an auxiliary beam sensor 14 is used, but it is connected directly to the door controller 4 in the present embodiment. The auxiliary beam sensor 14 may be connected to the data bus 2 instead.

Each of the sensors 8, 10, 12 and 14 may be one of various types, and may be, for example, a sensor including a light-emitter-receiver unit including a plurality of light-emitting elements for emitting infrared light and a plurality of light-receiving elements for receiving the emitted infrared light, and a control unit for controlling the light-emitter-receiver unit and outputting a detection result representative signal.

Another automatic door constituting unit may be locking means, e.g. an electric lock. The electric lock locks the door of the automatic door system, for example. The electric lock includes lock driving means, e.g. a solenoid 16, which solenoid 16 is controlled by locking control means, e.g. an electric lock controller 18. The electric lock controller 18 is connected to the data bus 2 and controls the solenoid 16 in accordance with the detected situation and the door position.

The automatic door constituting units also include an authentication unit 20. The authentication unit 20 is disposed in a location where security is required, e.g. an entrance to an apartment building, and is used to restrict entrance to the building by means of password authentication or biometric authentication using a finger print. Also, another automatic door constituting unit may be parameter setting means, e.g. a portable regulator 22. The regulator 22 is for permitting a particular person to set up the door controller 4 including the setting of parameters, such as a door speed, and the setting of the detection areas etc. in the sensors 8, 10 and 12. The regulator 22 communicates, via a cable, a radio wave or light, with a protocol transformer 24 connected to the data bus 2. The protocol transformer 24 transforms the protocol of the communication signal to a form communicable with the door controller 4 and the sensors 8, 10, and 12, so that the regulator 22 can communicate with the door controller 4 etc. through the data bus 2. When a cable is used to connect the protocol transformer 24 with the regulator 22, the protocol transformer 24 and the regulator 22 can be integrated. Still another automatic door constituting unit may be display means, e.g. a display unit 26 with a liquid crystal panel. The display unit 26 is connected to the data bus 2 and provides a display of a working state etc. of the automatic door system in accordance with information pieces other automatic door constituting units send onto the data bus 2.

The automatic door constituting units 4, 8, 10, 12, 18, 20, 24 and 26 can communicate with each other via the data bus 2. For that purpose, each of the automatic door constituting units 4, 8, 10, 12, 18, 20, 24 and 26 is provided with communicating means, e.g. a built-in CAN transceiver and a built-in CAN controller.

In this automatic door system, all of the automatic door constituting units 8, 10, 12, 18, 20, 24 and 26 need not be connected to the other automatic door constituting units, except for a particular automatic door constituting unit, e.g. the door controller 4. Also, the automatic door system can include plural automatic door constituting units of the same kind, for example, two door controllers 4 because automatic door constituting units differ depending on desired specifications. For example, according to one specification, the solenoid 16 and the electric lock controller 18 associated with the electric lock are not used. Alternatively, if a particular specification requires the use of an electric lock, plural types of solenoids and electric lock controllers may be provided beforehand, and the solenoid and controller suitable for the specification are selected. Also, there may be provided many types of sensors, from which the ones suitable for the specification may be selected for the indoor actuating sensor 8, the outdoor actuating sensor 10 and the auxiliary sensor 12.

Unit information is assigned to each of the automatic door constituting units 4, 8, 10, 12, 18, 20, 24 and 26. The unit information is information representative of an associated automatic door constituting unit, and is composed of, for example, a unit ID, a machine ID and an installation site ID. The unit IDs are identification codes, which are assigned to the respective ones of the automatic door constituting units 4, 8, 10, 12, 18, 20, 24 and 26 when the automatic door system is installed. The machine IDs are identification codes assigned to the respective machine types of the automatic door constituting units. They are identification codes assigned to, for example, a door controller for a light-weighted door, a door controller for a heavy-weighted door, an infrared-type actuating sensor, a radio wave-type actuating sensor, an infrared auxiliary sensor, an electric lock controller, a protocol transformer, and a display, depending on their types. The installation site IDs are identification codes representing where the associated unit is installed, e.g. indoors, outdoors, within a lintel, above a ceiling, and below a lintel.

Each of the automatic door constituting units 4, 8, 10, 12, 18, 20, 24 and 26 generates operation information. The operation information is composed of, for example, the previously mentioned unit information, self-diagnosis information, and working state information. The self-diagnosis information is information representing the result of self-diagnosis of the condition of each of the automatic door constituting units 4, 8, 10, 12, 18, 20, 24 and 26 done by its own self-diagnosing means. The details of the self-diagnosing means provided for each sensor 8, 10, 12 are disclosed in, for example, Patent Literature 1, which is cited by reference in the present specification. Self-diagnosis of the electric lock is described later. The working state information is information representing the working state of each of the automatic door constituting units 4, 8, 10, 12, 18, 20, 24 and 26. As for the door controller 4, for example, information about the door position, the door speed, the door moving direction, the collision detection etc. is the working state information. As for the sensors 8, 10 and 12 each having a detection area consisting of a number of smaller detection areas, information representing the detection in each smaller detection areas is the working state information. As for the electric lock controller 18, the position of the solenoid 16, for example, the locking position or the unlocking position, is the working state information, Each of the automatic door constituting units 4, 8, 10, 12, 18, 20, 24 and 26 is arranged so as to extract only information that unit requires for its operation, from the operating information sent on the data bus 2.

Figure 2:
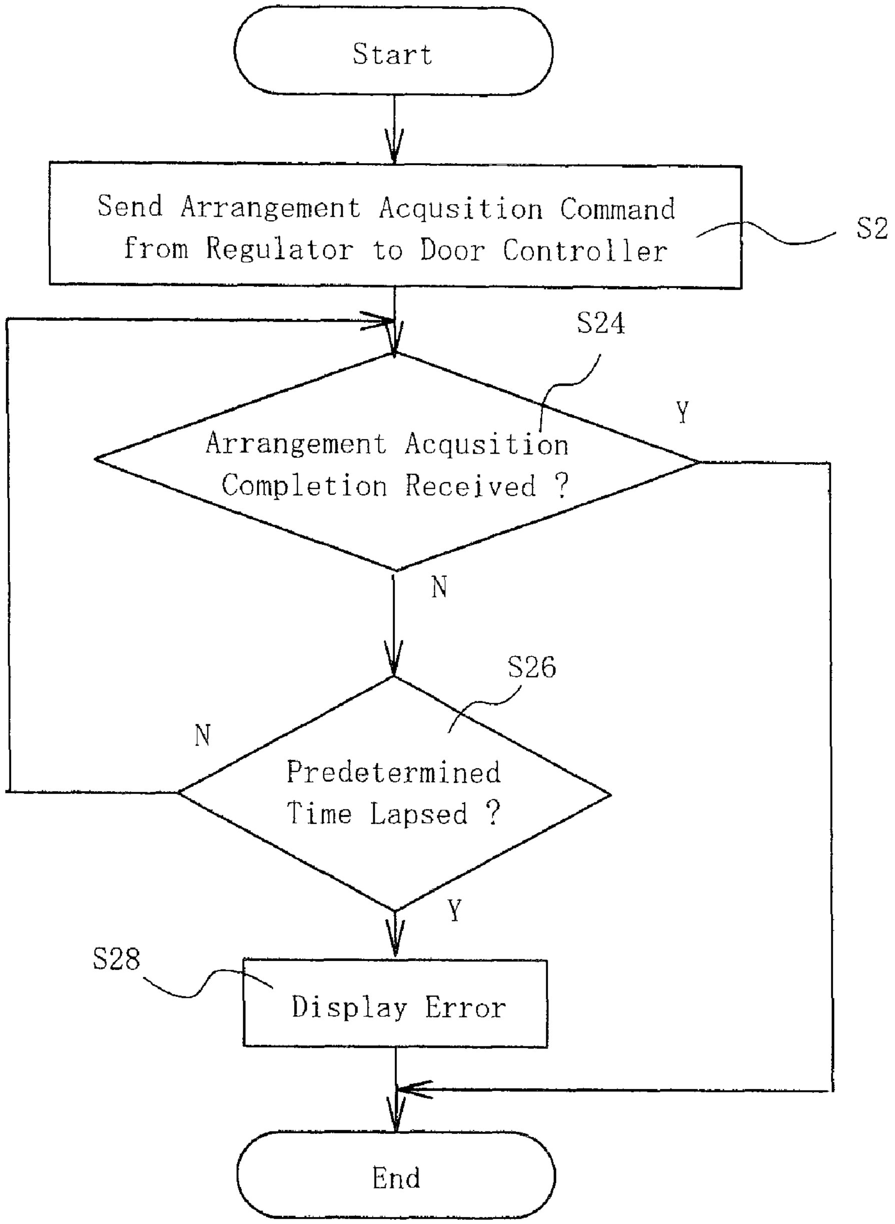
FIG. 2 is a flow chart of processing performed by a regulator of the automatic door system of FIG. 1.
Figure 3:
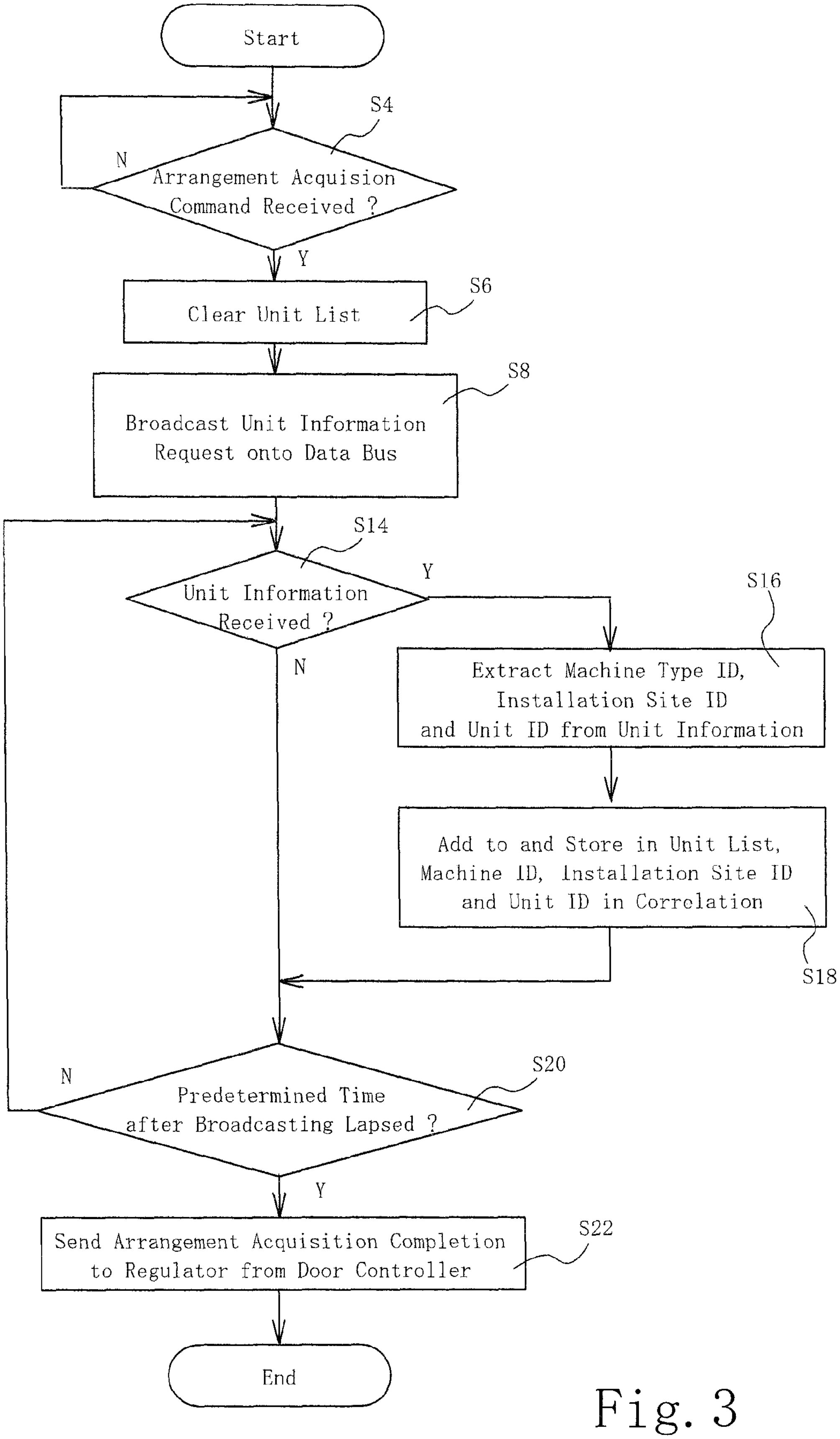
FIG. 3 is a flow chart showing the processing performed by a door controller of the automatic door system of FIG. 1 when the system is installed.
Figure 4:
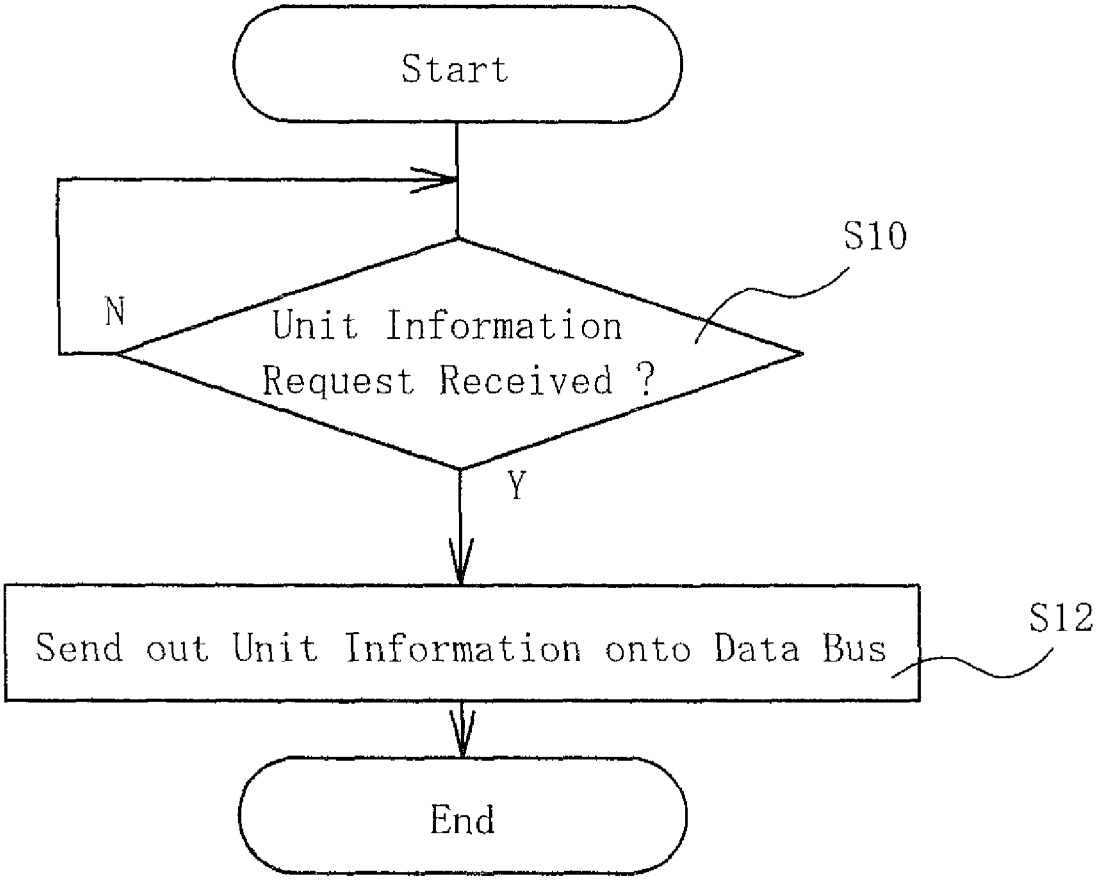
FIG. 4 is a flow chart of the processing performed in automatic door constituting units, other than the door controller, of the automatic door system of FIG. 1 when the system is installed.

After the automatic door system is installed, processing shown in FIGS. 2 through 4 is done. FIG. 2 shows the processing done in the regulator 22, FIG. 3 shows the processing done in the door controller 4, and FIG. 4 shows the processing done in the other automatic door constituting units 8, 10, 12, 18, 20, 24 and 26.

Referring to FIG. 2, first, the regulator 22 sends an arrangement acquisition command to the door controller 4 (Step S2). As shown in FIG. 3, the door controller 4 judges whether it has received the arrangement acquisition command (Step S4). Step S4 is repeated until the answer "YES" is obtained. When the answer of the judgment becomes "YES", the door controller 4 clears a list in which unit information of the automatic door constituting units 8, 10, 12, 18, 20, 24 and 26 are stored therein, for example, a unit list (Step S6), and sends, by broadcasting, a unit information request onto the data bus 2 (Step S8). As shown in FIG. 4, each of the other automatic door constituting units 8, 10, 12, 18, 20, 24 and 26 judges whether it has received a unit information request (Step S10). Step S10 is repeated until the answer to this question becomes "YES". When the answer "YES" is obtained, each of the other automatic door constituting units 8, 10, 12, 18, 20, 24 and 26 sends out its unit information onto the data bus 2 (Step S12), and the processing ends.

Subsequent to Step S8, the door controller 4 makes a judgment as to whether it has received unit information of the other automatic door constituting units 8, 10, 12, 18, 20, 24 and 26 from the data bus 2 (Step S14). If the answer to this judgment is "YES", the machine ID, the installation site ID and the unit ID are extracted from the received unit information (Step S16). The extracted machine ID, installation site ID and unit ID are added to the unit list for storage, being correlated with each other (Step S18). The unit list is stored in a non-volatile memory means (not shown), e.g. an EEPROM, in the door controller 4, and, therefore the content of the unit list can be held even when power supply is interrupted.

Subsequent to Step S18, or when the answer to the judgment in Step S14 is "NO", it is determined whether or not a predetermined time has lapsed since the broadcasting was made (Step S20). This predetermined time is a time t set a little longer than the time necessary for obtaining unit information from all of the other automatic door constituting units, assuming that the largest possible number of automatic door constituting units connectable in the automatic door system are connected to the data bus 2. If the answer to the question in Step S20 is "NO", the processing is repeated from Step S14. When the answer to Step S20 changes to "YES", which means that the unit information from all of the automatic door constituting units 8, 10, 12, 18, 20, 24 and 26 has been obtained, arrangement acquisition completion is sent from the door controller 4 to the regulator 22 (Step S22).

As shown in FIG. 2, subsequent to Step S2, the regulator 22 makes a judgment as to whether the regulator 22 has received the arrangement acquisition completion from the door controller 4 (Step S24), and, if the answer is "NO", makes a judgment as to whether a predetermined time has lapsed since the sending of the arrangement acquisition command (Step S26). This predetermined time is a time T set a little longer than the time necessary for receiving the arrangement acquisition completion from the door controller 4 after the arrangement acquisition command is sent out, and T is predetermined to be longer than t (T>t). If the answer in Step S26 is "NO", the processing is performed again from Step S24. If the answer in Step S26 is "YES", which may mean that the door controller 4 or the regulator 22 has some trouble, ERROR is displayed on the display unit provided for the regulator 22 (Step S28), and this processing is finished. When the answer in Step S24 is "YES", the processing is finished, too.

As described, by simply sending an arrangement acquisition command from the regulator 22, the unit information of the other automatic door constituting units 8, 10, 12, 18, 20, 24 and 26 can be automatically stored in the unit list in the door controller 4. Accordingly, an operator need not set unit information of the automatic door constituting units 8, 10, 12, 18, 20, 24 and 26 one by one in the door controller 4, when the automatic door system is installed. This can ease the installation operation.

Figure 5:
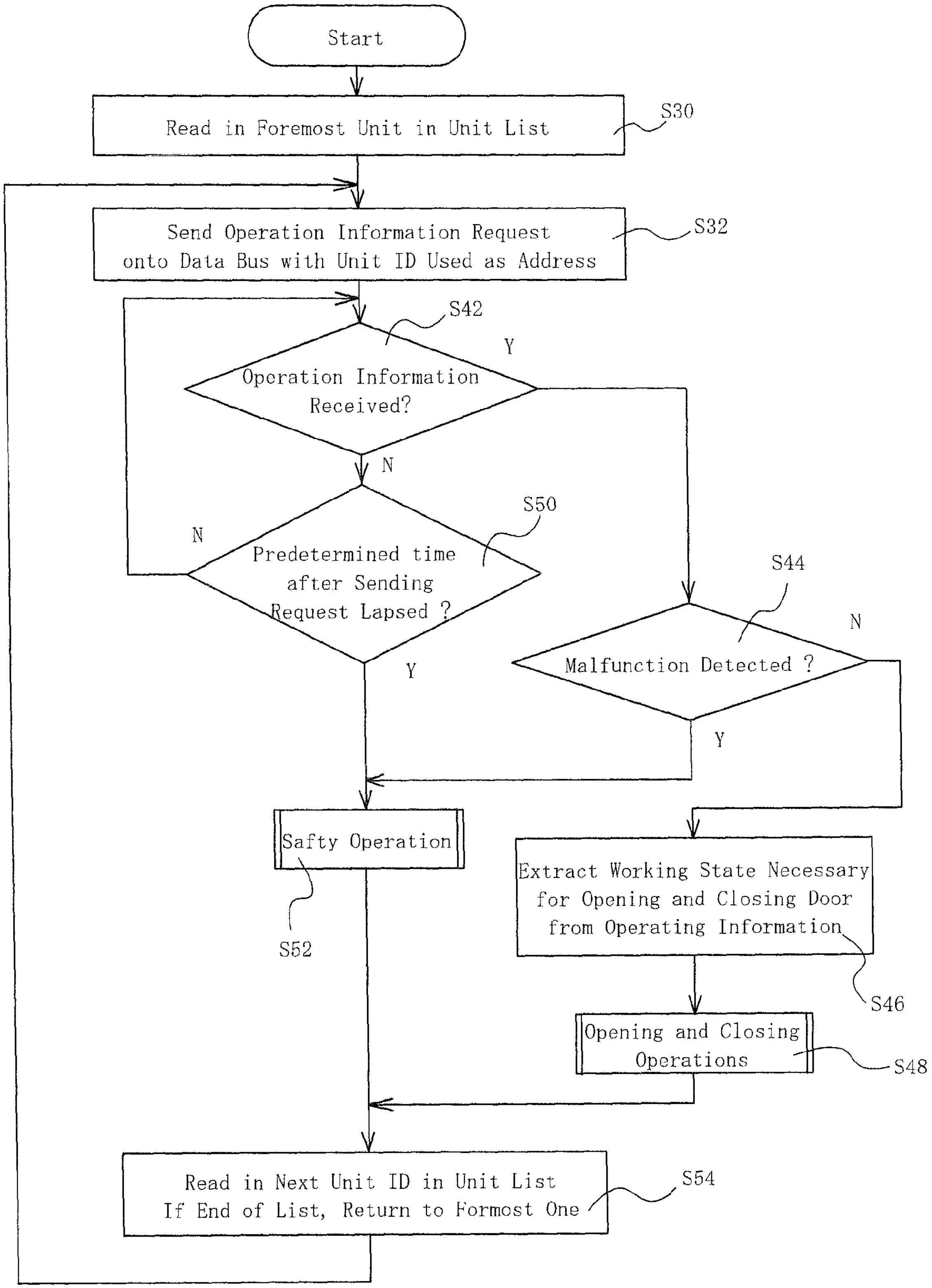
FIG. 5 is a flow chart of the processing usually performed by the door controller of the automatic door system of FIG. 1.
Figure 6:
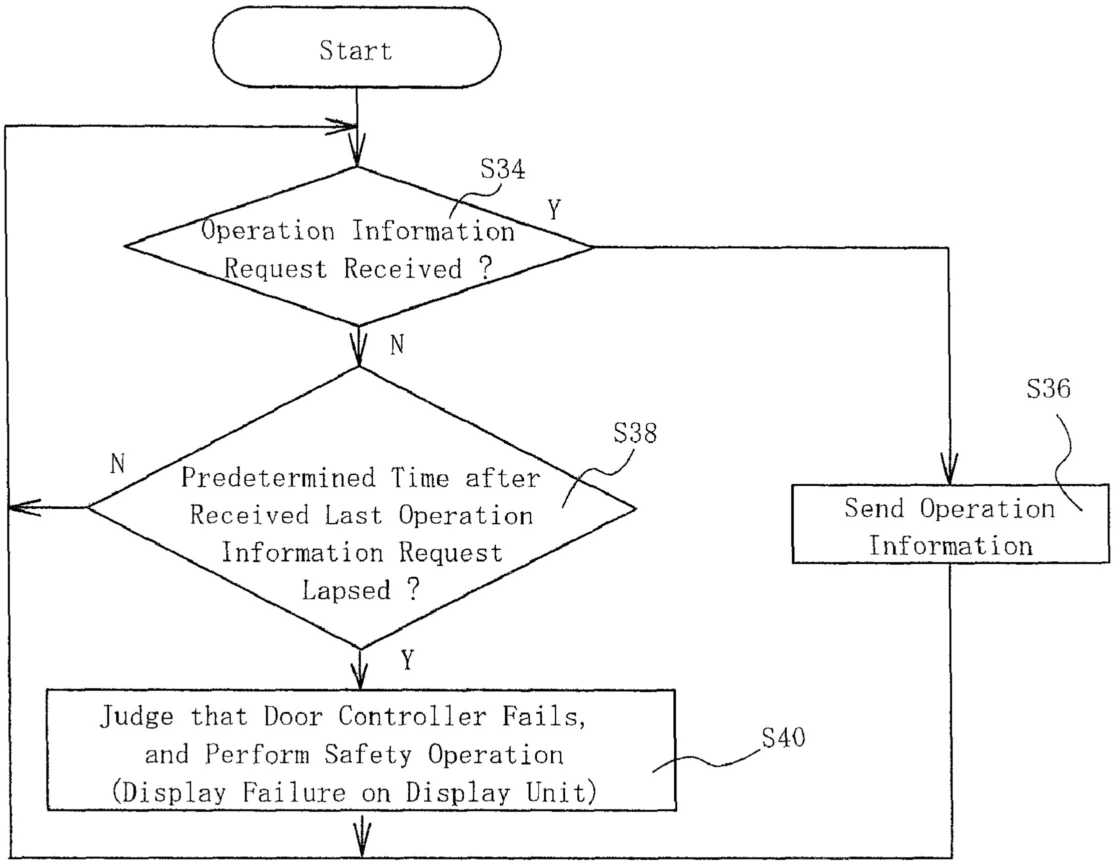
FIG. 6 is a flow chart of the processing usually performed by the automatic door constituting units other than the door controller.

During the operation of the automatic door system, processing as shown in FIGS. 5 and 6 is performed. FIG. 5 shows the processing performed by the door controller 4, and FIG. 6 shows the processing performed by each of the other automatic door constituting units 8, 10, 12, 18, 20, 24 and 26.

As shown in FIG. 5, in the door controller 4, the foremost unit ID in the unit list is read in (Step S30). Then, an operation information request is sent onto the data bus 2, using the read in unit ID as an address (Step S32).

In other words, a particular one of the automatic door constituting units 8, 10, 12, 18, 20, 24 and 26 is called. Instead of using a particular unit ID as the address, broadcasting, using all of the unit IDs as the addresses, may be employed. In each of the other automatic door constituting units 8, 10, 12, 18, 20, 24 and 26, a judgment is made as to whether it receives an operation information request addressed to its own unit ID (Step S34). If the answer is "YES", that automatic door constituting unit sends its operation information onto the data bus 2 (Step S36), and Step S34 is performed again. If the answer to the judgment in Step S34 is "NO", it is determined whether a predetermined time has lapsed from the last sending of the operation information request (Step S38).

As described later, the door controller 4, when it finishes sending the operation information request to all of the other automatic door constituting units 8, 10, 12, 18, 20, 24 and 26, sends again the operation information request to the other automatic door constituting units 8, 10, 12, 18, 20, 24 and 26 in order, first from the foremost unit in the unit list. It should be noted that, if broadcasting is used, addressing all the unit IDs, instead of addressing a particular unit ID, the operation information request is sent out at such time intervals as to enable the door controller 4 to receive the operation information from all of the automatic door constituting units 8, 10, 12, 18, 20, 24 and 26. In either case, the time intervals at which the door controller 4 sends out the operation information request to the other automatic door constituting units 8, 10,

12, 18, 20, 24 and 26 can be considered substantially constant. Accordingly, if one particular automatic door constituting unit does not receive an operation information request when the predetermined time period equivalent to the above-described time interval has lapsed from the receipt of the last operation information request (i.e. the answer in Step S38 is "YES"), it is reasonable to judge that the door controller 4 is out of order. Then, safety operation, e.g. display of "out of order" on the display unit 26, is carried out (Step S40), and the processing is performed again from Step S34.

The use of Step S38 and Step S40 as described above makes it possible to know the malfunction of the door controller 4, which itself judges whether the other automatic door constituting units 8, 10, 12, 18, 20, 24 and 26 operate well or malfunction.

As shown in FIG. 5, after sending out an operation information request in Step S32, the door controller 4 determines if it has received operation information from the other automatic door constituting unit the door controller 4 called (Step S42). If the answer is "YES", the door controller 4 determines, form the self-diagnosis information contained in the received operation information, if the called, other automatic door constituting unit 8, 10, 12, 18, 20, 24 or 26 malfunctions (Step S44). If the answer to this question is "NO", the working state necessary for opening and closing the door, contained in the operation information from the currently called, other automatic door constituting unit 8, 10, 12, 18, 20, 24 or 26, is extracted (Step S46). For example, when the called, other automatic door constituting unit is the indoor actuating sensor 8 or the outdoor actuating sensor 10, person detection information is extracted, and this extracted working state information is use to open and close the door (Step S48). The details of the opening and closing operations will be described later.

If the judgment made in Step S42 is "NO", (i.e. if operation information has not been received), it is determined if a predetermined time from the request sending in Step S32 has been lapsed (Step S50). This predetermined time is a time set a little longer than the time required for the called, other automatic door constituting unit 8, 10, 12, 18, 20, 24 or 26 to send its operation information when it is operating in order. If the answer to the question in Step S50 is "NO", the processing is performed again from Step S42.

If the answer in Step S50 is "YES", it can be considered that communication with the other automatic door constituting unit 8, 10, 12, 18, 20, 24 or 26 is not in order because of, for example, interruption in the data bus 2. When the answer to the judgment in Step S50 is "YES" or if the answer to the judgment in Step S44 is "YES" (which means that the self-diagnosis contained in the received operation information indicates "failure"), the safety operation takes place (Step S52). The details of the safety operation will be described later.

Subsequent to Step S52 or subsequent to Step S48 (opening and closing operations), the next unit ID in the unit list is read in (Step S54). If the last unit ID in the unit list has been read in, in Step S54, the foremost unit ID is read in, and the processing is performed again from Step S32. Accordingly, the door controller 4 repeatedly calls the other automatic door constituting units 8, 10, 12, 18, 20, 24 and 26 one by one in order. It should be noted that, if the broadcasting, addressing all of the unit IDs, is used instead of addressing a particular unit ID, this step is not necessary.

Figure 7:
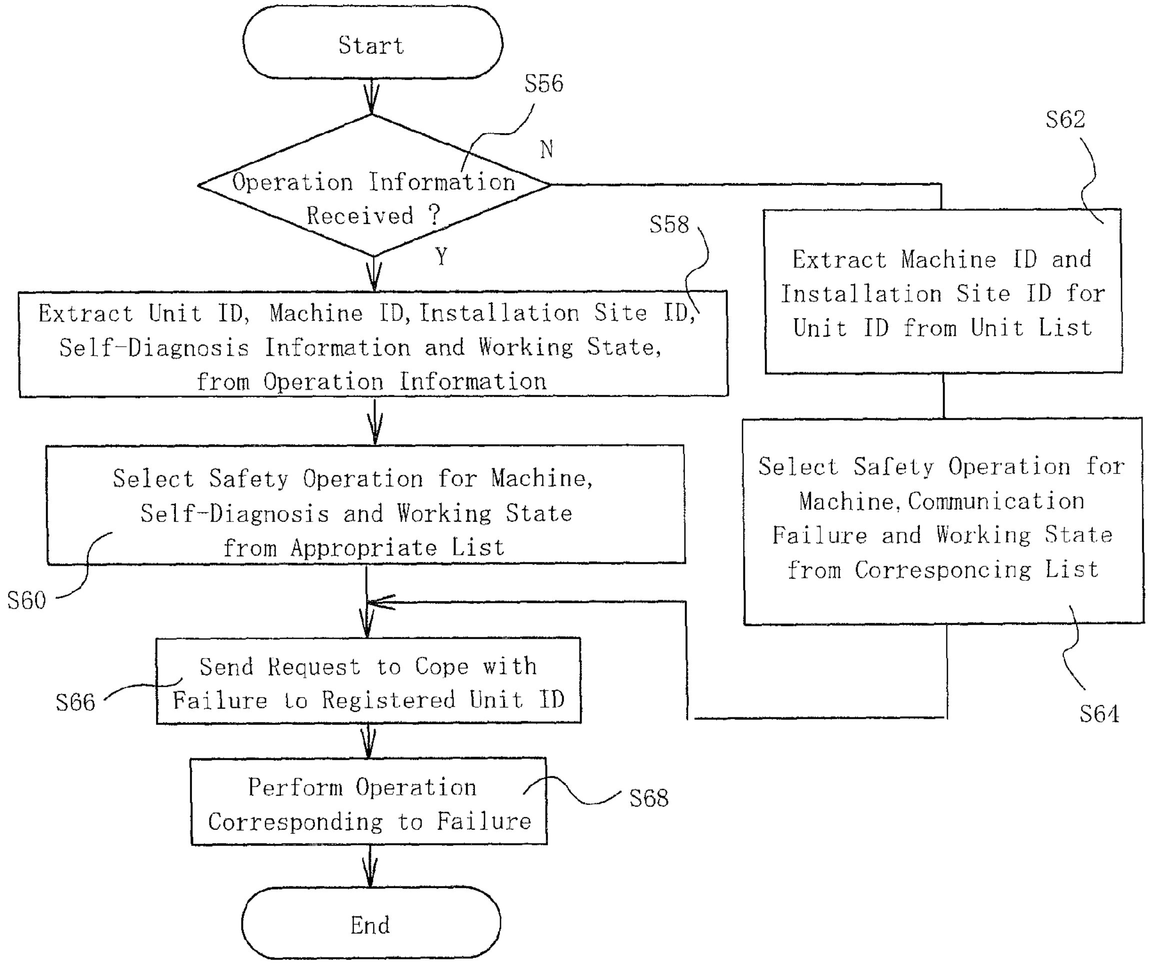
FIG. 7 is a detailed flow chart of the safety operation in the processing shown in FIG. 5.

As the safety operation in Step S52, the processing as shown in FIG. 7 is executed. In the processing, first it is judged whether operation information has been received or not (Step S56). In other words, it is judged whether communications are not possible due to, for example, line interruption, or the automatic door constituting unit 8, 10, 12, 18, 20, 24 or 26 is out of order. The failure of the automatic door constituting unit is of such a level which that automatic door constituting unit can find for itself and can notify it to external device. If the answer to the judgment is "YES", or, in other words, if the automatic door constituting unit 8, 10, 12, 18, 20, 24 or 26 is out of order, the unit ID, the machine ID, the installation site ID, the self-diagnosis information and the working state are extracted from the operation information (Step S58), and the safety operation suitable for the extracted self-diagnosis information and the working state is selected from the measure list (Step S60).

Specifically, the door controller 4 has stored therein, measure lists like the ones shown in TABLES 1 through 3, for example. TABLE 1 is for either of the indoor and outdoor actuating sensors 8 and 10, in which various safety operations are determined depending on the malfunctioning parts and the door operation. For example, the malfunctioning parts include a control section of actuating sensors, a predetermined number N or more of elements of the light-emitting-receiving unit, and less than the predetermined number N of elements of the light-emitting-receiving unit. The door positions include the fully opened position, a position during the course of opening, the fully closed position, and a position during the course of closing. The normal operation means opening and closing operations in the normal condition and operation of detecting moving persons, and the low-speed opening operation or low-speed closing operation means an operation to open or close the door at a lower speed than in the normal condition. The full-open state maintenance or full-closed state maintenance means maintaining the motor 6 driven in the opening or closing direction or maintaining the door locked by means of the electric lock. The control stop means stopping control on the motor 6 and control by the electric lock controller 18, so that the door can be manually opened or closed.

TABLE 1

Relation between Malfunctioning Parts of Actuating Sensors and Safety Operations

| | Safety Operation for Respective Door Positions | | | |
|---|---|---|---|---|
| Malfunctioning Part | Full-Close Position | During Opening | Full-Open Position | During Closing |
| Control Unit | Low-Speed Opening operation, or Control Stop, or Closed | Full-Open State Maintenance after Normal Opening | Control Stop | Stop, or Full-Open State Maintenance after |

TABLE 1-continued

| Relation between Malfunctioning Parts of Actuating Sensors and Safety Operations | | | | |
|---|---|---|---|---|
| | Safety Operation for Respective Door Positions | | | |
| Malfunctioning Part | Full-Close Position | During Opening | Full-Open Position | During Closing |
| | State Maintenance, depending on Setting | Operation | | Low-Speed Opening Operation, or Full-Closed State Maintenance after Low-Speed Closing Operation, depending on Setting |
| Light-Emitting-Receiving Unit (with N or More Malfunctioning Elements) | Low-Speed Opening Operation, or Control Stop, or Closed State Maintenance, depending on Setting | Full-Open State Maintenance after Normal Opening Operation | Control Stop | Stop, or Full-Open State Maintenance after Low-Speed Opening Operation, or Full-Closed State Maintenance after Low-Speed Closing Operation, depending on Setting |
| Light-Emitting-Receiving Unit (Less than N Malfunctioning Elements) | Normal Operation | Normal Operation | Normal Operation | Normal Operation |
| Communication Failure | Low-Speed Opening Operation, or Control Stop, or Closed State Maintenance, depending on Setting | Full-Open State Maintenance after Normal Opening Operation | Control Stop | Stop, or Full-Open State Maintenance after Low-Speed Opening Operation, or Full-Closed State Maintenance after Low-Speed Closing Operation, depending on Setting |

TABLE 2 is for the auxiliary sensor 12, in which safety operations are determined depending on the malfunctioning parts and the door operation. The malfunctioning parts are the control unit and the light-emitting-receiving unit, and the door positions are the fully opened position, a position during the course of opening, the fully closed position, and a position during the course of closing.

TABLE 2

| Relation between Malfunctioning Parts of Auxiliary Beam Sensor/Auxiliary Sensor and Safety Operations | | | | |
|---|---|---|---|---|
| | Safety Operation for Respective Door Positions | | | |
| Malfunctioning Parts | Full-Closed Position | During Opening | Full-Open Position | During Closing |
| Control Unit | Low-Speed Opening Operation, or Control Stop, | Stop, or Full-Open State Maintenance after Low-Speed | Control Stop | Stop, or Full-Closed State Maintenance after Low-Speed |

TABLE 2-continued

Relation between Malfunctioning Parts of Auxiliary Beam Sensor/Auxiliary Sensor and Safety Operations

| Malfunctioning Parts | Safety Operation for Respective Door Positions: Full-Closed Position | During Opening | Full-Open Position | During Closing |
|---|---|---|---|---|
| | or Closed State Maintenance, depending on Setting | Opening Operation, depending on Setting | | Closing Operation, depending on Setting |
| Light-Emitting-Receiving Unit | Low-Speed Opening Operation, or Control Stop, or Closed State Maintenance, depending on Setting | Stop, or Full-Open State Maintenance after Low-Speed Opening Operation, depending on Setting | Control Stop | Stop, or Full-Closed State Maintenance after Low-Speed Closing Operation, depending on Setting |
| Communication Failure | Low-Speed Opening Operation, or Control Stop, or Closed State Maintenance, depending on Setting | Stop, or Full-Open State Maintenance after Low-Speed Opening Operation, depending on Setting | Control Stop | Stop, Operation, or Full-Closed State Maintenance after Low-Speed Closing Operation, depending on Setting |

TABLE 3 is for the electric lock, in which safety operations are determined depending on the malfunctioning parts and the door operation. The malfunctioning parts are the control unit (electric lock controller 18), the inoperativeness of the actuator (solenoid 16) and the difficulty in operation of the actuator. The inoperativeness and difficulty in operation will be described later. The door positions are the fully opened position, a position during the course of opening, the fully closed position, and a position during the course of closing.

TABLE 3

Relation between Malfunctioning Parts of Electric Lock and Safety Operations

| Malfunctioning Parts | Safety Operation for Respective Door Positions: Full-Closed Position | During Opening | Full-Open Position | During Closing |
|---|---|---|---|---|
| Control Unit | Control Stop | Stop, or Full-Open State Maintenance after Normal Opening Operation, depending on Setting | Control Stop | Stop, or Full-Open State Maintenance after Low-Speed Opening Operation, or Low-Speed Closing Operation to Given Position, depending on Setting |
| Actuator (Inoperativeness) | Control Stop | Stop, or Full-Open State Maintenance after Normal Opening Operation, depending on Setting | Control Stop | Stop, or Full-Open State Maintenance after Low-Speed Opening Operation, or Low-Speed Closing Operation to Given Position, depending on Setting |
| Actuator (Difficulty in Operation) | Suspension of Operation of Electric Lock, and Normal | Suspension of Operation of Electric Lock, and Normal Operation | Suspension of Operation of Electric Lock, and Normal | Suspension of Operation of Electric Lock, and Normal Operation |

TABLE 3-continued

Relation between Malfunctioning Parts of Electric Lock and Safety Operations

| Malfunctioning Parts | Safety Operation for Respective Door Positions | | | |
|---|---|---|---|---|
| | Full-Closed Position | During Opening | Full-Open Position | During Closing |
| Communication Failure | Operation Control Stop | Stop, or Full-Open State Maintenance after Normal Opening Operation, depending on Setting | Operation Control Stop | Stop, or Full-Open State Maintenance after Low-Speed Opening Operation, or Low-Speed Closing Operation to Given Position, depending on Setting |

Accordingly, one of TABLES 1 through 3 is selected for the machine ID, and the safety operation in the selected TABLE is determined for the malfunctioning part determined from the self-diagnosis information and the door position determined from the working state information.

If the answer to the question in Step S56 is "NO", or, in other words, in case of communication failure due to line interruption, resulting in receiving no operation information, the machine ID for the called unit ID and the installation site ID are extracted from the unit list (Step S62), and the safety operation is selected from the list relevant to the extracted machine and communication failure due to line interruption (Step S64). In the lists, as shown in TABLES 1, 2 and 3, there are included the communication failure due to line interruption, as the malfunctioning parts for the actuating sensors, the auxiliary sensors and the electric lock, and the safety operation for each door position is set. The door position is detected by the door controller 4, and, therefore it is known. Accordingly, one of TABLES 1 through 3 is selected based on the machine ID. Since the malfunctioning part has been determined to be communication failure due to line interruption in Step S56, the safety operation for the door position is selected from the safety operations for the communication failure shown in the selected TABLE.

When the safety operation is determined in Step S60 or Step S64, a failure remedy request is sent onto the data bus 2, using, as an address, the unit ID of the pre-registered automatic door constituting unit 8, 10, 12, 18, 20, 24 or 26 (Step S66). For example, when the pre-registered automatic door constituting unit is the display unit 26, the failure remedy request with failure detail information added thereto is sent to the display unit 26, and the display unit 26, when receiving the failure remedy request, display the occurrence of failure and its detail. Subsequent to Step S66, the failure corresponding operation according to the determined safety operation is performed (Step S68).

Figure 8:
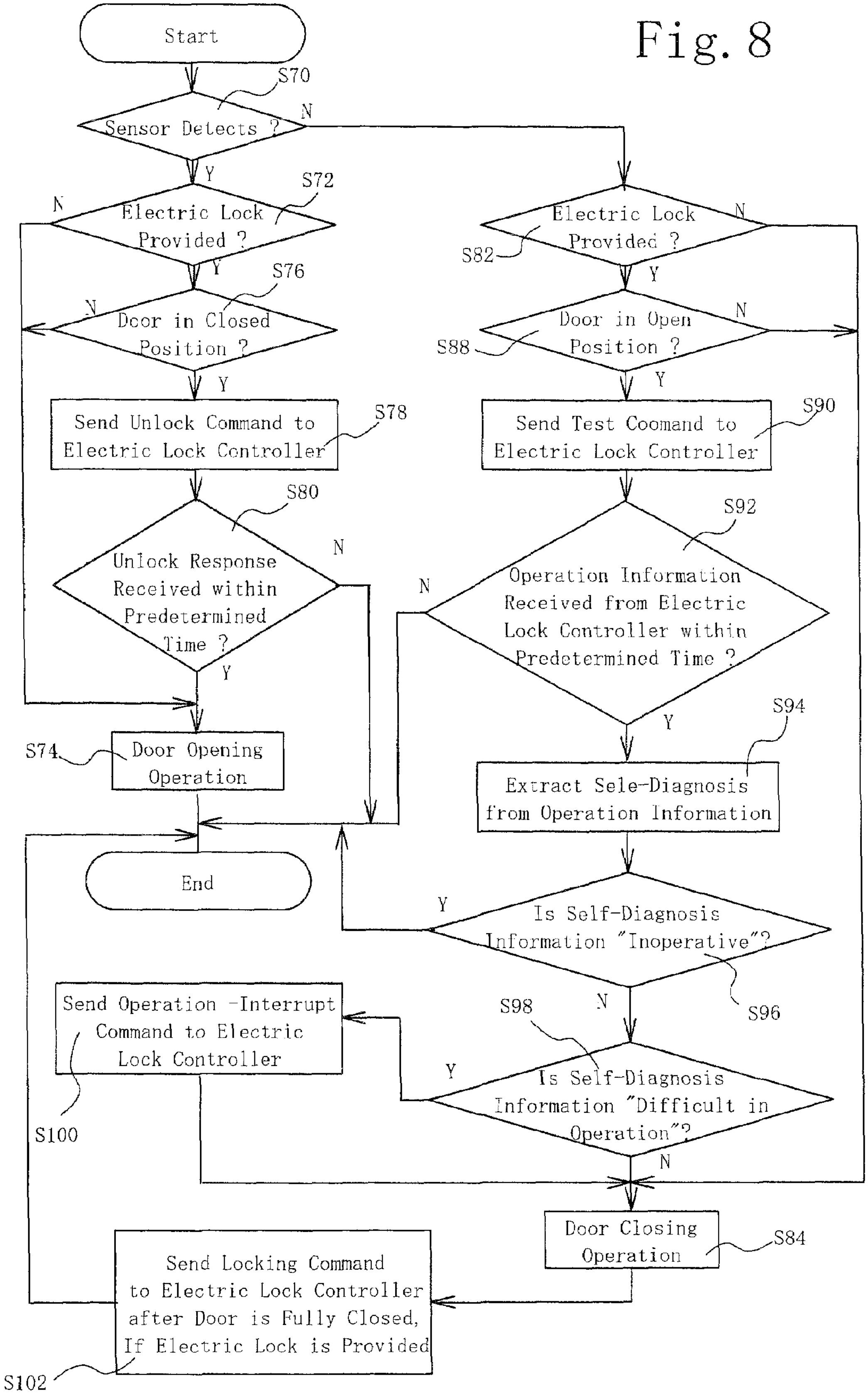
FIG. 8 is a detailed flow chart of the opening-closing operation in the processing shown in FIG. 5.

For the opening and closing operations in Step S48, the processing shown in FIG. 8, for example, is achieved. First, it is determined if the indoor or outdoor actuating sensor is sensing a person who is going to use the door (Step S70). If the answer to this question is "YES", it is determined if the automatic door system is provided with the electric lock (Step S72). If the answer is "NO", the door is opened (Step S74), and the processing ends.

If the answer to the question made in Step S72 is "YES" (i.e. the electric lock is provided), it is determined if the door is in the fully closed position (Step S76). If the answer is "NO", the door opening operation of Step S74 is carried out, and the processing is finished.

If the answer to the judgment made in Step S76 is "YES", an unlock command signal is sent to the electric lock controller 18 (Step S78) and it is monitored if an unlock notifying response is received within a predetermined time (Step S80). The predetermined time is set a little longer than the time between the sending of the unlock command signal and the receiving of the unlock notifying response, when the electric lock operates in order. The answer of "NO" to the question in Step S80 means that the electric lock is out of order, so that the door cannot be opened. Then, this processing is finished. If the answer of "YES" in Step S80, meaning that the door can be opened, the door opening operation of Step S74 is performed, and the processing is finished.

When the answer to the question in Step S70 is "NO" (i.e. if neither the indoor actuating sensor 8 nor the outdoor actuating sensor 10 detects a person who is going to use the door), it is determined if the automatic door system is provided with an electric lock (Step S82). When the answer to the question is "NO", the door closing operation is carried out (Step S84). When the answer to the question in Step S82 is "YES", it is determined if the door is in the fully open position (Step S88). If the answer to the question in Step S88 is "NO", the closing operation in Step S84 is performed.

When the answer to the question in Step S88 is "YES" (i.e. when the door is in the fully opened position), a test command is sent to the electric lock controller 18 (Step S90). As will be described later, this causes the electric lock controller 18 to self-diagnose the electric lock as to whether the electric lock can operate in order or not, if the electric lock controller 18 has no communication failure such as line interruption. Then, the electric lock controller 18 adds the self-diagnosis information to its operation information, and sends it onto the data bus 2.

Subsequent to Step S90, it is judged whether the operation information has been received from the electric lock controller 18 within a predetermined time (Step S92). This predetermined time is set a little longer than the time between the sending out of the test command signal and the sending by the electric lock controller 18, assuming that it is operating in order, of its operation information. When the answer to the question in Step S92 is "NO", it can be concluded that the electric lock has communication failure such as line interruption, and therefore this processing is finished without performing the door closing operation.

When the answer to the question in Step S92 is "YES", the self-diagnosis information is extracted from the operation information received from the electric lock controller 18 (Step S94). The self-diagnosis information is one of "normal", "inoperative" and "difficult in operation". Subsequent to Step S94, judgment as to if the self-diagnosis information is "inoperative" is made (Step S96). If the answer to the question is "YES", the processing is finished without performing the door closing operation. If the answer to the question in Step S96 is "NO", it is determined if the operation information is "difficult in operation" (Step S98). If the answer is "YES", a command to interrupt the operation of the electric lock controller 18 is sent onto the data bus 2 (Step S100), to thereby interrupt the locking by the electric lock, and, after that, the door closing operation in Step S84 is performed. When the judgment in Step S98 is "NO", meaning that the electric lock can operate in order, the door closing operation in Step S84 is performed.

Subsequent to the closing operation in Step 84, if the automatic door system is provided with an electric lock, a locking command is sent onto the data bus 2 after the door is fully closed (Step S102), to thereby cause the electric lock controller 18 to carry out the locking, and the processing is finished.

Figure 9:
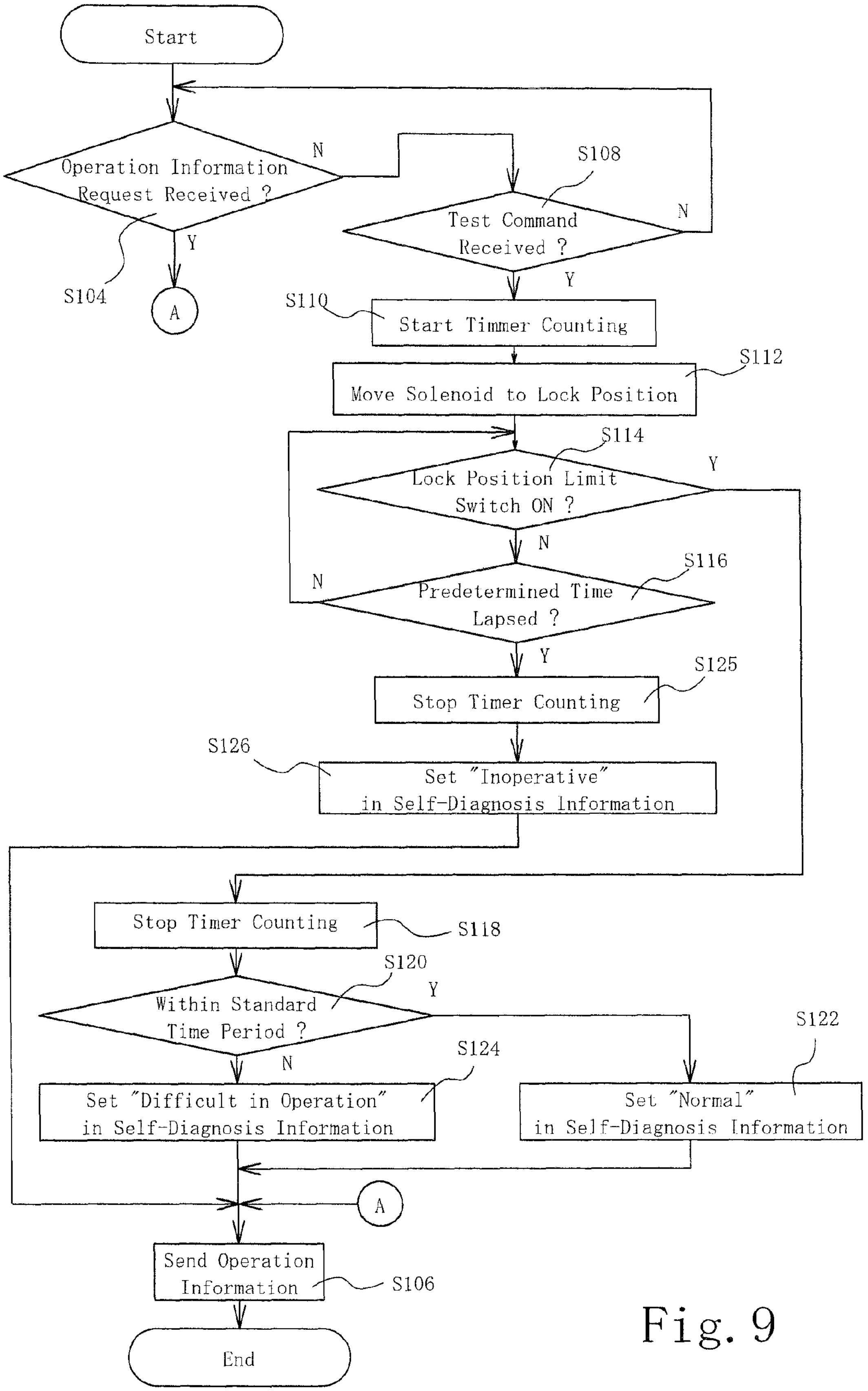
FIG. 9 is a flow chart of the processing usually performed by an electric lock controller of the automatic door system of FIG. 1.

FIG. 9 shows the processing executed in the electric lock controller 18. First, the electric lock controller 18 judges if it has received an operation information request (Step S104). If the answer to the question is "YES", the electric lock controller 18 sends the operation information (Step S106), and ends this processing. If the answer to the question in Step S104 is "NO", the controller 18 judges whether it has received the above-described test command (Step S108). If the answer to this question is "NO", the processing is repeated again from Step S104.

When the answer to the question in Step S108 is "YES", timer counting for judging if the solenoid 16 operates in order is started (Step S110), and the solenoid 16 is moved to the lock position (Step S112). Then, it is determined if a lock position limit switch, which is arranged to be turned on when the solenoid 16 reaches the lock position, is ON (Step S114). If the answer to the question is "NO", it is determined if a predetermined time has been lapsed (Step S116). This predetermined time is set to be a little longer than the time between the time when the normally operative solenoid 16 is commanded to move to the lock position and the time when the limit switch is turned on. If the answer to this question is "NO", the processing is repeated again from Step S114.

When the answer to the question in Step S114 is "YES", the counting on the timer is stopped (Step S118), and it is determined if the count is within the reference time period (Step S120). When the count is within this reference time period, the solenoid 16 can be considered to be in order. When the answer to the question is "YES", meaning that the solenoid 16 is working in order, "normal" is set in the self-diagnosis information (Step S122). If the answer to the question is "NO", meaning that, although the solenoid 16 is operating, it has not moved to the lock position within the reference time period, then "difficult in operation" is set in the self-diagnosis information (Step S124).

When the answer to the question in Step S116 is "YES", meaning that the solenoid 16 did not move to the lock position within the predetermined time, the timer counting is stopped (Step S125), and "inoperative" is set in the operation information (Step S126).

When the operation information is set in Step S122, Step S124 or Step S126, the operation information including the self-diagnosis information is sent onto the data bus 2, and the processing is finished.

Constituting components of an automatic door system according to a second embodiment of the present invention are the same as those of the first embodiment. The processing executed in the door controller 4 and the processing executed in the other automatic door constituting units 8, 10, 12, 18, 20, 24 and 26, when the system is installed, and the processing executed in the door controller 4 and the other automatic door constituting units when the automatic door system is in operation, are different from those in the system according to the first embodiment.

Figure 10:
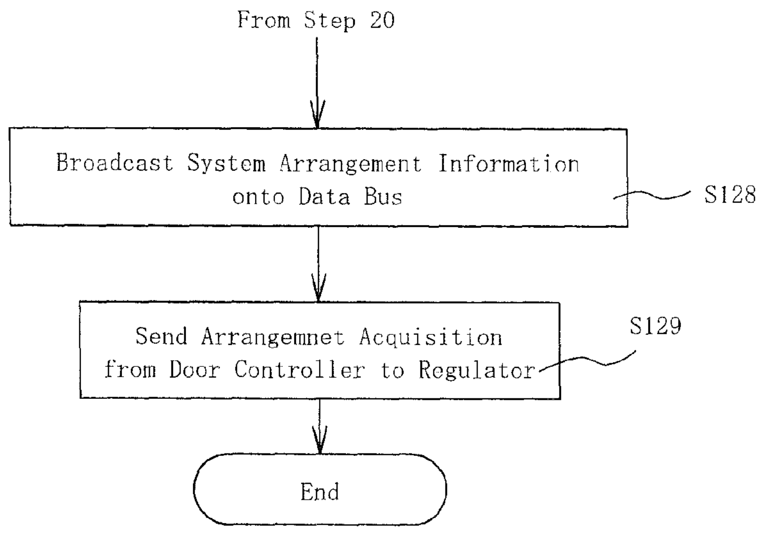
FIG. 10 is a flow chart of part of the processing performed by a door controller of an automatic door system according to a second embodiment of the invention when the automatic door system is installed.

After the automatic door system is installed, the same processing as shown in FIG. 3, from START to Step S20 where it is determined if a predetermined time has lapsed from the broadcasting, is executed. As shown in FIG. 10, when the answer to the question made in Step S20 becomes "YES", the system arrangement information including the unit list is broadcast onto the data bus 2 (Step S128), and the arrangement acquisition completion is sent from the door controller 4 to the regulator 22 (Step S129), and the processing is ended.

Figure 11:
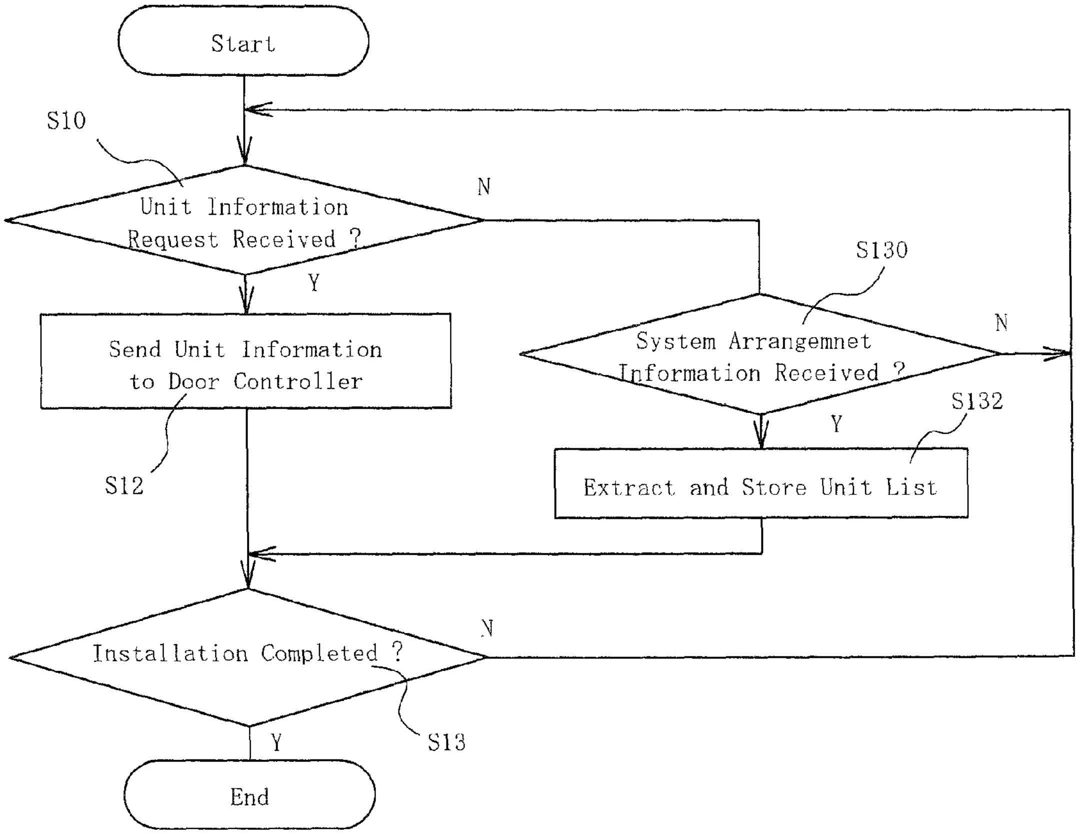
FIG. 11 is a flow chart of the processing performed by automatic door constituting units, other than the door controller, of the automatic door system according to the second embodiment when the automatic door system is installed.

The processing performed in each of the other automatic door constituting units 8, 10, 12, 18, 20, 24 and 26 is as shown in FIG. 11, and, when it judges in Step S10 that it has not received a unit information request, it determines if it has received system arrangement information from the door controller 4 (Step S130), and repeats the processing from Step S10 when the answer is "NO". If the answer to the question made in Step S130 is "YES", it extracts the unit list from the system arrangement information and stores it (Step S132), and, if the installation has been completed, it ends the processing (Step S13). Also, after each of the other automatic door constituting units 8, 10, 12, 18, 20, 24 and 26 sends the unit information to the door controller 4 in Step S12, it finishes the processing if the installation has been completed (Step S13). It should be noted that, since the unit list is stored in the EEPROM (not shown) of each of the other automatic door constituting units 8, 10, 12, 18, 20, 24 and 26, the contents of the unit list can be reserved even when power is turned off.

Figure 12:
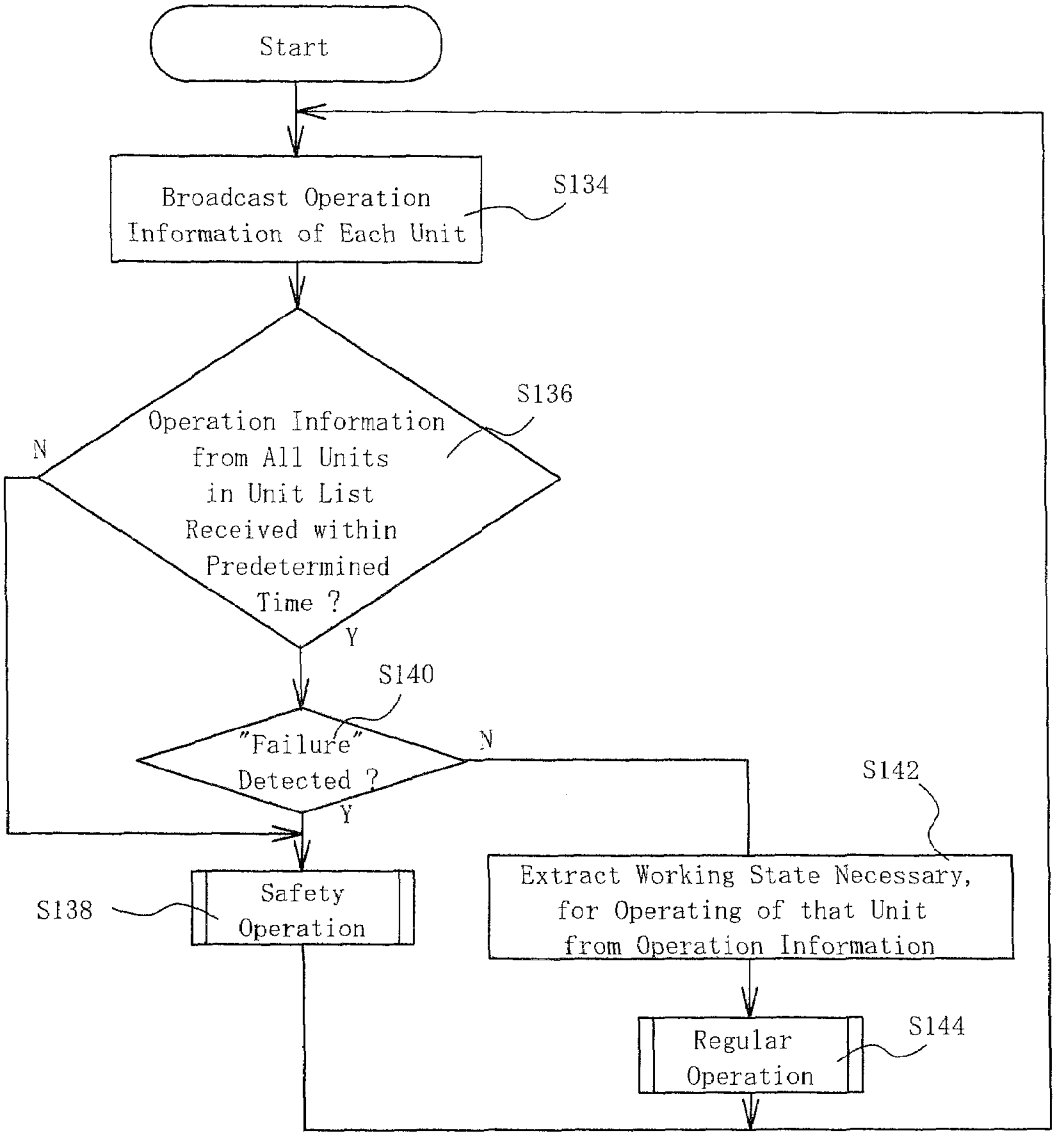
FIG. 12 is a flow chart of the processing usually performed by the automatic door constituting units of the automatic door system according to the second embodiment.

All of the automatic door constituting units 4, 8, 10, 12, 18, 20, 24 and 26 each perform the processing as shown in FIG. 12. Specifically, each unit broadcasts its operation information onto the data bus 2 (Step S134). After that, it judges whether it has received the operation information of all the automatic door constituting units 4, 8, 10, 12, 18, 20, 24 and 26 (excluding that unit) listed in the unit list within a predetermined time (Step S136). The predetermined time is set to be a little longer than the time necessary to receive the operation information from all of the automatic door constituting units 4, 8, 10, 12, 18, 20, 24 and 26. If the question made in Step S136 is "NO", the safety operation is carried out (Step S138). The safety operation is as shown in FIG. 7 when the unit is the door controller 4, and, when the unit is the other automatic door constituting unit 8, 10, 12, 18, 20, 24 or 26, a display is made on the display unit 26 as in the case of the safety operation in Step S40 in FIG. 6. If a simple structured display, e.g. a LED, is provided as an automatic door constituting unit, it can be additionally operated. After the safety operation, the processing is repeated from Step S134.

When the answer to the question in Step S136 is "YES", it is determined if any of the received operation information contains a self-diagnosis indicating "failure" (Step S140), and, if the answer is "YES", the safety operation of Step S138 is performed. If the judgment of "NO" is made in Step S140, the working state necessary for the operation of that particular unit is extracted from the respective received operation information (Step S142), and the regular operation is performed, using the extracted information (Step S144). For example, the door controller 4 performs the processing for opening and closing the door shown in FIG. 8. The sensors 8, 10 and 12 each control the light emitting-receiving sections, judge, using the received-light signal from the light receiving section, if it detects a person going to use the door, make self-diagnosis, etc. Following Step S144, the processing of Step S140 is performed again.

The automatic door constituting units of an automatic door system according to a third embodiment of the present invention are the same as the ones in the system according to the first embodiment. According to the third embodiment, the automatic door controller 4 prepares the unit list not when the installation is completed, but when power is supplied to the automatic door system.

Figure 13:
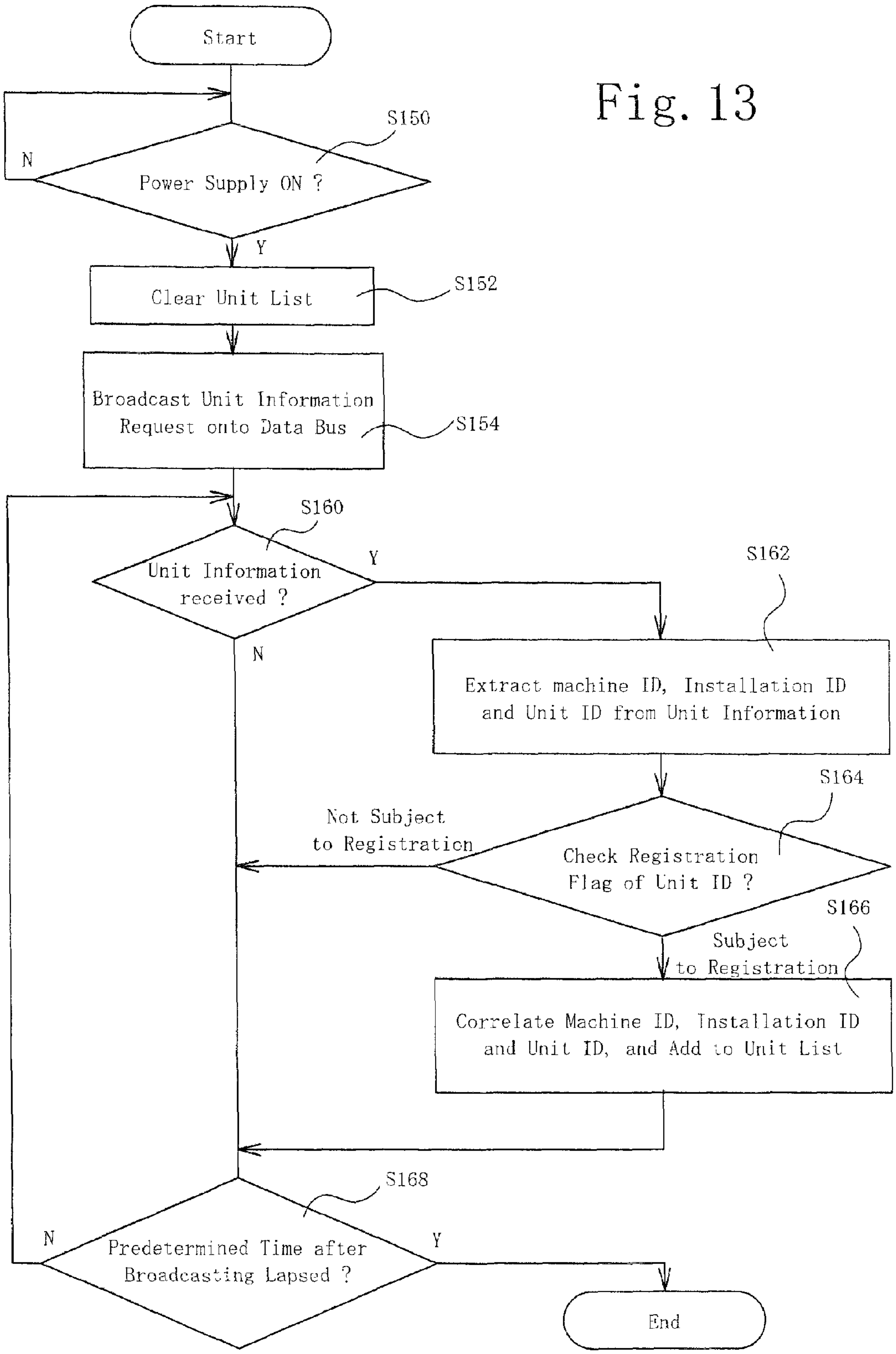

As shown in FIG. 13, the door controller 4 determines if power is supplied to the automatic door system (Step S150), and, if the answer is "NO", repeats Step S150. When the answer changes to "YES", the door controller 4 clears the unit list (Step S152), and broadcasts a unit information request onto the data bus 2 (Step S154).

Figure 14:
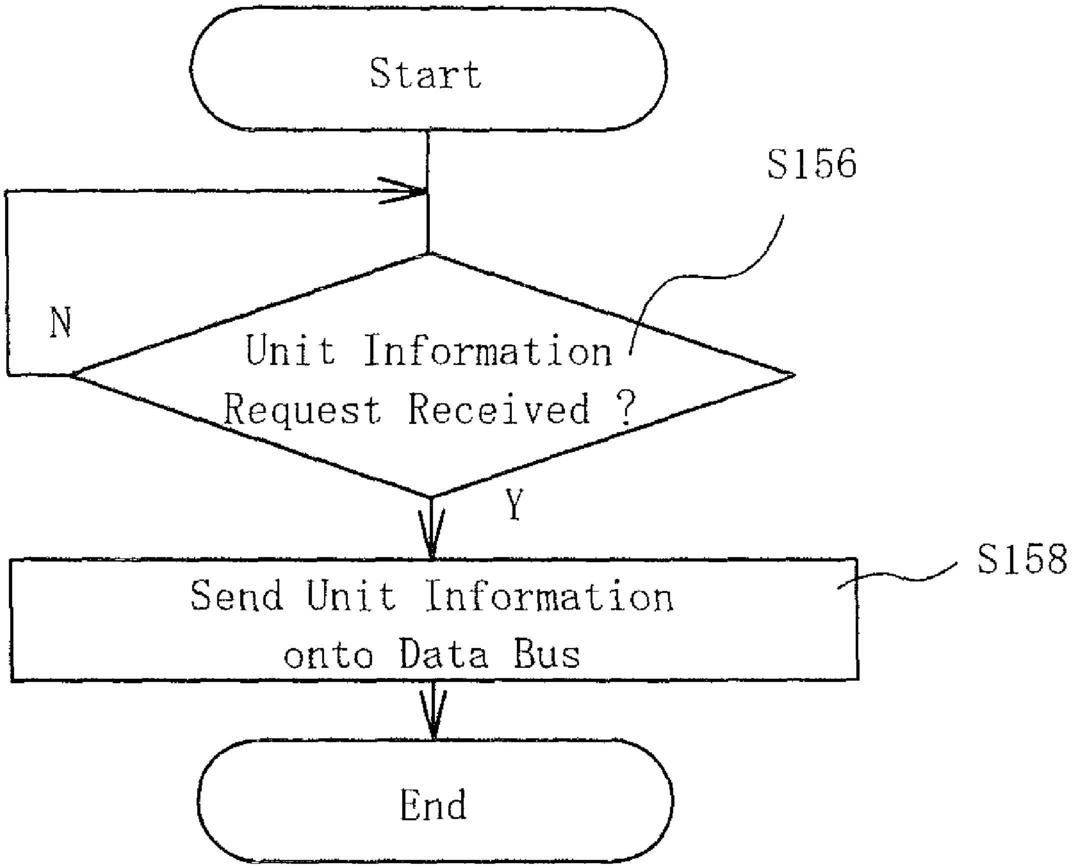

As shown in FIG. 14, each of the other automatic door constituting units 8, 10, 12, 18, 20, 24 and 26 determines if it has received the unit information request (Step S156). If the answer is "NO", Step S156 is repeated. When the answer changes to "YES", each of the other automatic door constituting units 8, 10, 12, 18, 20, 24 and 26 sends out its own unit information onto the data bus 2 (Step S158), and ends the processing.

As shown in FIG. 13, subsequent to Step S154, the door controller 4 determines if it has received unit information (Step S160). If it has ("YES"), the door controller 4 extracts the machine ID, the installation site ID and the unit ID from the received unit information (Step S162). Next, the door controller 4 checks a registration flag of the extracted unit ID (Step S164). The registration flag is a flag indicating if that automatic door constituting unit is subject to registration in the unit list, and is attached when that unit is manufactured. The registration flag is part of the unit ID. For example, in the respective automatic door constituting units, the sensors are subject to registration, but the regulator 22 is not subject to registration. If a particular unit is judged to be subject to registration in Step S164, its machine ID, installation site ID and unit ID are correlated to each other and additionally stored in the unit list (Step S166). It should be noted that, according to this embodiment, the unit list is stored in volatile memory means (not shown), e.g. a RAM, in the door controller 4, and therefore, if power to the system is cut off, the content of the unit list is discarded. Subsequent to Step S166, or when it is judged in Step S160 that unit information has not been received, or when it is determined in Step S164 that the unit ID of a particular unit is not subject to registration, it is determined if a predetermined time has lapsed since the broadcasting was made (Step S168). The predetermined time is set a little longer than the time necessary for acquiring unit information from all the other automatic door constituting units, assuming that the maximum number of automatic door constituting units connectable in the automatic door system are connected to the data bus 2. When the answer to the question made in Step S168, the processing is repeated from Step S160, and, when the answer is "YES", the processing is finished.

When the processing is finished, the unit list contains data of the automatic door constituting units connected to the data bus 2 at the time when power is supplied to the system. After that, the processing shown in FIG. 5 is performed as in the first embodiment. In this case, even when an automatic door constituting unit, e.g. the electric lock controller 18, unimportant for the opening and closing operation of the automatic door system, becomes out of order, the safety operation is performed until it is repaired, and the failure of the electric lock controller 18 is displayed on the display unit 26. When the power supply to the system is cut off, the content of the unit list stored in the RAM (not shown) of the door controller 4 is discarded. When the owner or the caretaker of the system detaches the malfunctioning electric lock controller 8 from the data bus 2 and causes power to be supplied to the system, the electric lock controller 18 is not entered into the unit list. Accordingly, operation information indicating malfunctioning is not received, and communication failure, e.g. line interruption, is not subject to judgment. Therefore the automatic door system can be opened and closed as usual. With this arrangement, the system owner or the like can select either continuing the operation of the automatic door system or manually operating the system to be a temporary countermeasure, depending on the situation.

Figure 15:
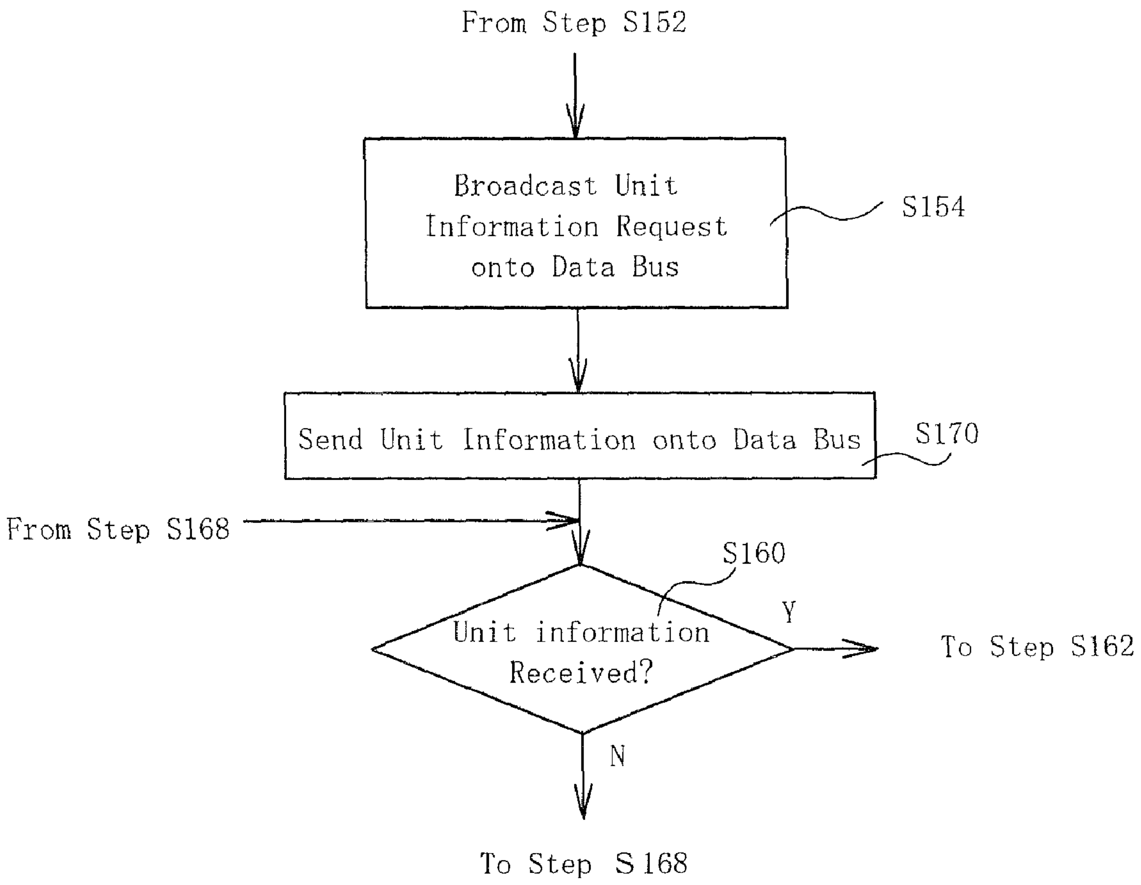

The constituting components according to a fourth embodiment of the present invention are the same as those of system according to the first embodiment. According to the fourth embodiment, too, the automatic door controller 4 prepares the unit list not when the automatic door system has been completely installed, but when power is supplied to the automatic door system. Also, each of the automatic door constituting units has the unit list. As shown in FIG. 15, the processing done in the door controller 4 when power is supplied is the same as the one according to the third embodiment, except the addition of a step of sending the unit information of each unit onto the data bus 2 (Step S170) after the unit information request is sent out onto the data bus 2 in Step S154.

Figure 16:
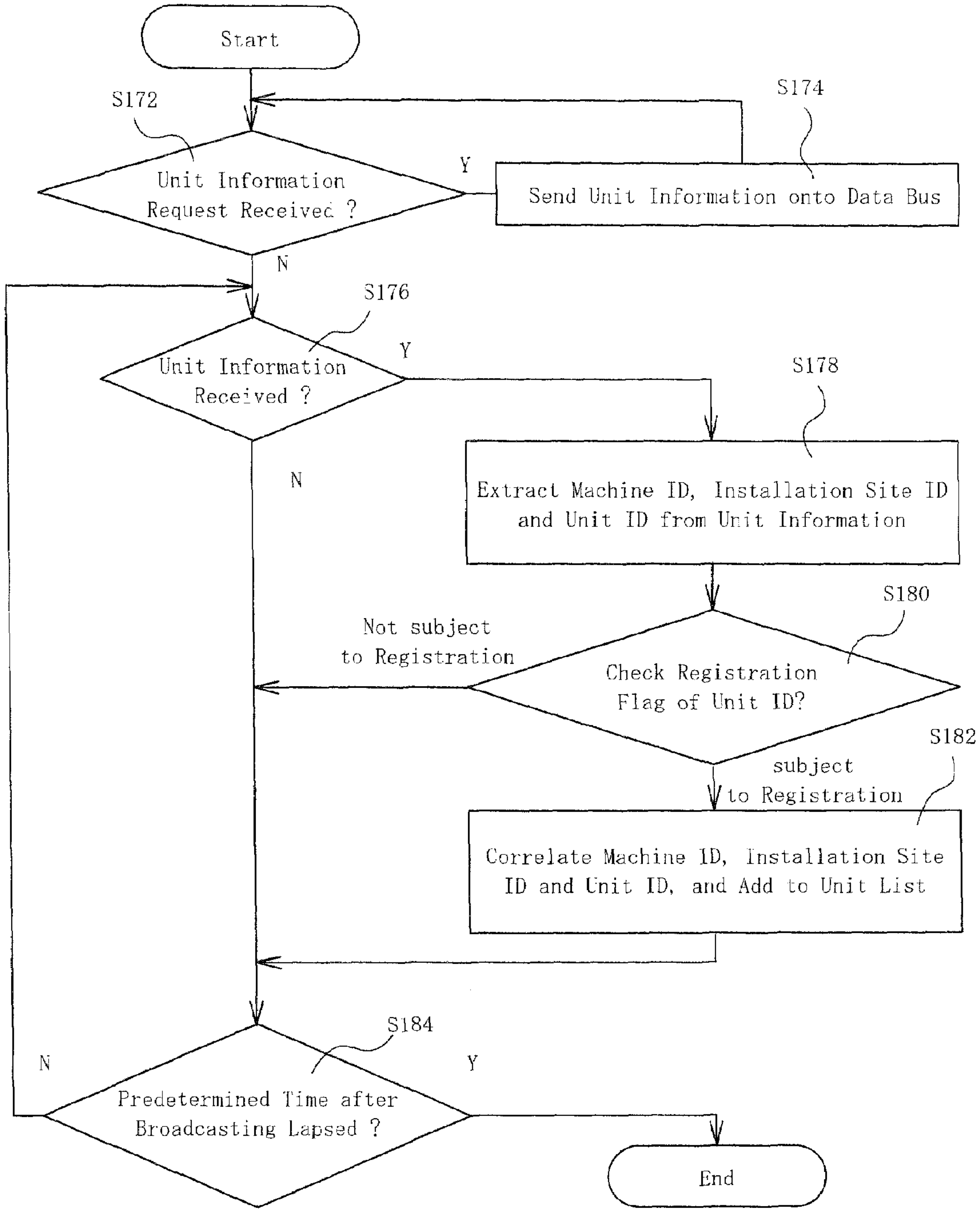

As shown in FIG. 16, each of the automatic door constituting units 8, 10, 12, 18, 20, 24 and 26, except the door controller 4, judges whether it has received the unit information request (Step S172). If it has received the unit information request, it send out its own unit information onto the data bus 2 (Step S174), and executes Step S172 once more. If the answer to the question in Step S172 is "NO", each automatic door constituting unit judges whether it has received unit information from another automatic door constituting unit (Step S176). If the answer to the question is "YES", the machine ID, the installation site ID and the unit ID are extracted from the received unit information (Step S178). Next, the registration flag of the extracted unit ID is checked (Step S180). If the unit is judged to be subject to registration, the machine ID, the installation ID and the unit ID are additionally stored in the unit list, being correlated with each other (Step S182). According to this embodiment, the unit list is stored in the RAM (not shown) of the door controller 4, and therefore the content of the unit list is discarded when power supply to the system is cut off. Subsequent to Step S182, or when it is judged that the unit information has not been received in Step S176, or when the unit ID is not subject to registration in Step S180, it is determined if a predetermined time from the broadcasting has lapsed (Step S168). The predetermined time is set to be a little longer than the time necessary for acquiring the unit information from all of the maximum number of automatic door constituting units connectable to the data bus 2. If the answer to this question is "NO", the processing is performed again from Step S176, and, when the answer to this question is "YES", the processing is finished.

As the result of this processing, a unit list is formed in each of the automatic door constituting units 4, 8, 10, 12, 18, 20 and 26. After that, the processing shown in FIG. 12 is done as in the second embodiment. Even when an automatic door constituting unit, e.g. the electric lock controller 18, unimportant for the opening and closing of the door becomes out of order, the automatic door system is subjected to the safety operation and the malfunctioning of the electric lock controller 18 is displayed on the display unit 26, until the electric lock controller 18 is repaired. When power supply to the system is cut off, the content of the unit lists stored in the RAMs (not shown) of the automatic door constituting units 8, 10, 12, 18, 20 and 26 is discarded. When the system owner or caretaker detaches the electric lock controller 18 from the data bus 2 and turns on the power supply, the electric lock controller 18 is not entered into the unit lists. Then, since operation information indicating malfunctioning is not received, and communication failure, e.g. line interruption, with the controller 18 is not subject to judgment, the automatic door can be operated as usual. With this arrangement, the system owner or caretaker can select continuing the operation of the automatic door system or manually operating the door system, to be a temporary countermeasure.

According to the above-described embodiments, no description has been given as to the manner in which the door is opened and closed, but the door may be of any one of various known types, such as sliding-type and swing-type. The automatic door constituting units are not limited to the ones shown in FIG. 1. For example, a program switch enabling the door caretaker to change the opening and closing modes of the door may be added.

What is claimed is:

1. An automatic door system comprising:

a bus; and a plurality of automatic door constituting units respectively connected to said bus so that said automatic door constituting units can communicate with each other via said bus;

at least one of said plurality of automatic door constituting units being a door control unit for controlling opening and closing of a door, the other automatic door constituting units being ones selected from units constituting said automatic door system, including an indoor actuating sensor, an outdoor actuating sensor, an auxiliary sensor, an electric lock controller, a protocol transformer and a display unit;

said door control unit being so arranged as to be able to call said other automatic door constituting units via said bus, said other automatic door constituting units being so arranged as to be able to respond to said calling;

said door control unit judging that communication failure has occurred in any one of said other automatic door constituting units said door control unit has called, when that one of said other automatic door constituting units does not respond to said calling within a first predetermined time after said calling.

2. The automatic door system according to claim 1, wherein said door control unit requests, via said bus, sending of unit information representing each of said other automatic door constituting units, prepares a list of said other automatic door constituting units connected to said bus from said unit information which said door control unit receives, and makes said calling based on said list.

3. The automatic door system according to claim 1, wherein said door control unit requests, via said bus, sending of unit information representing each of said other automatic door constituting units upon completion of installation of said automatic door system, prepares a list of said other automatic door constituting units connected to said bus from said unit information which said door control unit receives, and makes said calling based on said list.

4. The automatic door system according to claim 1, wherein said door control unit requests, via said bus, sending of unit information representing each of said other automatic door constituting units when power is supplied to said automatic door system, prepares a list of said other automatic door constituting units connected to said bus from said unit information which said door control unit receives, and makes said calling based on said list.

5. The automatic door system according to claim 1, wherein each of said other automatic door constituting units comprises self-diagnosing means, and includes diagnosis made by said self-diagnosing means thereof in the response when that unit responds to said door control unit; said door control unit controlling said door based on the diagnosis acquired when responded.

6. The automatic door system according to claim 1, wherein each of said other automatic door constituting units judges that said automatic door control unit is out of order when that unit does not receive a call within a second predetermined time after receiving the last call made by said automatic door control unit.

7. An automatic door system comprising:

a bus; and a plurality of automatic door constituting units respectively connected to said bus so that said automatic door constituting units can communicate with each other via said bus;

at least one of said plurality of automatic door constituting units being a door control unit for controlling opening and closing of a door, the other automatic door constituting units being ones selected from units constituting said automatic door system, including an indoor actuating sensor, an outdoor actuating sensor, an auxiliary sensor, an electric lock controller, a protocol transformer and a display unit;

each of said automatic door constituting units being so arranged as to be able to call and respond to the other automatic door constituting units via said bus, each automatic door constituting unit judging that communication failure has occurred with any one of said other automatic door constituting units when that one automatic door constituting unit does not respond within a predetermined time after calling that one automatic door constituting unit.

8. The automatic door system according to claim 7, wherein one of said plurality of automatic door constituting units sends, onto said bus, a request for unit information representing said other automatic door constituting units, prepares a list of said automatic door constituting units connected to said bus from said unit information received and its own unit information, and sends said list to said other automatic door constituting units via said bus; said automatic door constituting units identifying the other automatic door constituting units based on said list.

9. The automatic door system according to claim 7, wherein one of said plurality of automatic door constituting units sends, onto said bus; a request for unit information representing said other automatic door constituting units upon completion of installation of said automatic door system, prepares a list of said automatic door constituting units connected to said bus from said unit information received and its own unit information, and sends said list to said other automatic door constituting units via said bus; said automatic door constituting units identifying the other automatic door constituting units based on said list.

10. The automatic door system according to claim 7, wherein one of said plurality of automatic door constituting units sends, onto said bus, a request for unit information representing said other automatic door constituting units when power is supplied to said automatic door system, prepares a list of said automatic door constituting units connected to said bus from said unit information received and its own unit information, and sends said list to said other automatic door constituting units via said bus; said automatic door constituting units identifying the other automatic door constituting units based on said list.

11. The automatic door system according to claim 7, wherein said respective automatic door constituting units are provided with self-diagnosing means, and include diagnosis made by said self-diagnosing means thereof in the responses when said automatic door constituting units send the responses; said automatic door constituting units operating based on the diagnoses acquired when responded by the other automatic door constituting units.

* * * * *